(12) United States Patent
Park et al.

(10) Patent No.: US 11,559,838 B2
(45) Date of Patent: Jan. 24, 2023

(54) ALUMINUM-BASED AMORPHOUS METAL PARTICLES, CONDUCTIVE INKS AND OLED CATHODE COMPRISING THE SAME, AND MANUFACTURING METHOD THEREOF

(71) Applicant: KOREA ELECTRONICS TECHNOLOGY INSTITUTE, Seongnam-si (KR)

(72) Inventors: Keumhwan Park, Seongnam-si (KR); Chanjae Lee, Seoul (KR); Youngmin Kim, Seongnam-si (KR)

(73) Assignee: Korea Electronics Technology Institute, Seongnam-Si (KR)

( * ) Notice: Subject to any disclaimer, the term of this patent is extended or adjusted under 35 U.S.C. 154(b) by 278 days.

(21) Appl. No.: 16/987,116

(22) Filed: Aug. 6, 2020

(65) Prior Publication Data

US 2021/0202888 A1    Jul. 1, 2021

(30) Foreign Application Priority Data

Dec. 26, 2019  (KR) .................. 10-2019-0174727
Dec. 26, 2019  (KR) .................. 10-2019-0174731

(51) Int. Cl.
*C22C 21/00*    (2006.01)
*B22F 9/00*    (2006.01)
(Continued)

(52) U.S. Cl.
CPC ............ *B22F 9/002* (2013.01); *C09D 11/037* (2013.01); *C09D 11/52* (2013.01); *C22C 1/002* (2013.01);
(Continued)

(58) Field of Classification Search
CPC ...................................................... B22F 9/002
See application file for complete search history.

(56) References Cited

U.S. PATENT DOCUMENTS 5,260,128 A    11/1993  Ishii et al.
6,071,357 A *  6/2000  Guruswamy ........... H01L 41/20
                                                148/304
(Continued)

FOREIGN PATENT DOCUMENTS

KR    10-2005-0113035 A    12/2005
KR    10-2011-0086716 A     7/2011
(Continued)

OTHER PUBLICATIONS

Zhuo et al, Chin. Phys. Letters, vol. 26, No. 6, 2009, p. 066402. (Year: 2009).*
(Continued)

*Primary Examiner* — Christopher S Kessler
(74) *Attorney, Agent, or Firm* — Knobbe, Martens, Olson & Bear, LLP

(57) ABSTRACT

This application relates to an aluminum-based amorphous metal particles, a conductive Ink and OLED cathode including the aluminum-based amorphous metal particles, and a method of manufacturing the aluminum-based amorphous metal particles. In one aspect, the amorphous metal particles are represented by a formula $Al_xLi_yNi_zY_wCo_v$. Here, x, y, z, w, and v denote an atomic ratio, and satisfy the following relationships: $75.0 \leq x \leq 90.0$, $3.0 < y \leq 7.0$, $1.0 \leq z \leq 7.0$, $2.0 \leq w \leq 10.0$, $0.0 \leq v \leq 5.5$, and $x+y+z+w+v=100$.

13 Claims, 31 Drawing Sheets

(51) Int. Cl.
*H01L 51/00* (2006.01)
*C09D 11/52* (2014.01)
*C09D 11/037* (2014.01)
*C22C 1/00* (2006.01)

(52) U.S. Cl.
CPC .......... *C22C 21/00* (2013.01); *H01L 51/0022* (2013.01); *C22C 2200/02* (2013.01)

(56) References Cited

U.S. PATENT DOCUMENTS 9,870,840 B2 * 1/2018 Park .................. H01B 1/023
2013/0243699 A1 * 9/2013 Wang ................. C22C 33/006
420/128

FOREIGN PATENT DOCUMENTS

KR 10-1655365 B1 9/2016
KR 10-2019-0109863 A 9/2019

OTHER PUBLICATIONS

Office Action of Korean Patent Application No. 10-2019-0174727—7 pages (dated Jan. 26, 2021).

* cited by examiner

ALUMINUM-BASED AMORPHOUS METAL PARTICLES, CONDUCTIVE INKS AND OLED CATHODE COMPRISING THE SAME, AND MANUFACTURING METHOD THEREOF

CROSS-REFERENCE TO RELATED APPLICATION

The present application claims priority to Korean Patent Application Nos. 10-2019-0174727 and 10-2019-0174731, both filed on Dec. 26, 2019, in the Korean Intellectual Property Office, which are incorporated herein in their entirety by reference.

BACKGROUND

Field

The described technology relates to a conductive ink and, more particularly, to aluminum-based amorphous metal particles used in a state of being dispersed in a conductive ink, a conductive ink and an OLED cathode containing the aluminum-based amorphous metal particles, and a method of manufacturing the aluminum-based amorphous metal particles.

Description of the Related Technology

A vacuum deposition process may be used for a method of manufacturing a display device such as an organic light emitting diode (OLED) display device. The vacuum deposition process, however, may bring about lots of material loss and cause some difficulties in enhancing a precision of the process due to the use of a shadow mask. In particular, as size of the OLED display device becomes larger, a large-capacity deposition apparatus is required, which may increase a manufacturing cost of the display device and make a mass production of the display device more difficult.

To solve the problems, attention has been paid to a wet OLED manufacturing process, which is based on a solution process, such as inkjet printing. The solution process is environmental-friendly and advantageous for mass production while facilitating a production of small quantities of multiple types. Thus, the solution process may be an essential process technology for responding to a market expansion of large-sized display devices and flexible display devices.

A conductive ink containing metal particles is used in the solution process. Metal particles of various shapes such as spherical, wire, and dendrite-shaped particles may be used in the conductive ink depending on a purpose of use of the conductive ink.

The metal particles used in the conductive ink require an excellent conductivity as well as a stable chemical property that does not oxidize in a dispersed environment in the ink and under process conditions.

Therefore, silver which exhibits superior properties compared to other materials is widely being used for the conductive ink, but the use of silver which is an expensive material increases manufacturing costs of the display devices.

The use of aluminum particles which exhibits excellent conductivity and is easy to prepare may lower the manufacturing costs but is disadvantageous in that the aluminum particles oxidizes easily in air or in the solution. Further, in case of using aluminum, a sintering temperature of the particles increases and the electrical properties may be deteriorated.

Core-shell structure particles in which core particles such as copper or aluminum showing excellent conductivity are coated with silver have been developed to overcome the problems, but a process of preparing such particles is complicated.

Accordingly, it is necessary to solve the problems of the conventional materials by developing a material composed of low-cost metal elements and having excellent oxidation resistance properties.

Besides, despite having many advantages, the solution process has a significant problem that it is difficult to dissolve the materials in a solution. Thus, it is necessary to develop a new material that can solve the problem to modify the existing material.

In particular, while the printing technology of luminescent materials composed of organic materials has been developed continuously, the development of electrode materials is slow. Thus, in order for a printing technique to be applied to an entire OLED manufacturing process, it is necessary to develop a printable positive and negative electrodes material and a direct printing technique suitable for. the material.

That is, the electrode material is generally made of an inorganic material or an organic-inorganic composite material, and it is difficult to dissolve such materials in a solution. Furthermore, electrical properties of the electrode materials to be developed differ depending on the positive and negative electrodes and an emission mechanism, i.e. top emission or bottom emission.

In particular, the cathode material having a solution form, which has been rarely developed, is an essential factor to apply the printing technique to the entire OLED manufacturing process and is required to enhance a competitive edge of the OLED manufacturing process.

Some materials such as silver and gold may be used for the anode material in a state of being dissolved in a solution in terms of a process efficiency and stability, but such materials cannot be used for the cathode material because of their high work functions.

Metals that exhibit sufficiently low work function and superior electrical conductivity and can be used for the cathode material include aluminum (Al) and aluminum-lithium (Al—Li) alloys. Such materials, however, have high reactivity and are disadvantageous in that the materials oxidizes easily in air or in the solution, sintering temperature of the particles increases, and the electrical properties may be deteriorated.

SUMMARY

Provided are an aluminum-based amorphous metal particles composed of low-cost metal elements but having excellent electrical conductivity and oxidation resistance, a conductive ink and a cathode for OLED display device comprising the aluminum-based amorphous metal particles, and a method for manufacturing the aluminum-based amorphous metal particles.

Provided are an aluminum-based amorphous metal particles composed of elements having low work functions such as aluminum or lithium but having excellent oxidation resistance, a conductive ink and a cathode for OLED display device comprising the aluminum-based amorphous metal particles, and a method for manufacturing the aluminum-based amorphous metal particles.

According to an aspect of an exemplary embodiment, the present disclosure provides amorphous metal flakes represented by a formula $Al_xNi_zY_wCo_v$. Here, x, y, z, w, and v denote an atomic ratio, and $77.5 \leq x \leq 90.0$, $1.0 \leq z \leq 7.0$, $2.0 \leq w \leq 10.0$, $0.0 \leq v \leq 5.5$, and $x+y+z+w+v=100$.

The thickness of the amorphous metal particle may be in a range of 20 nm to 1000 nm.

According to another aspect of an exemplary embodiment, the present disclosure provides a conductive ink comprising amorphous metal flakes represented by a formula $Al_xNi_zY_wCo_v$. Here, x, y, z, w, and v denote an atomic ratio, and $77.5 \leq x \leq 90.0$, $10 \leq z \leq 7.0$, $2.0 \leq w \leq 10.0$, $0.0 \leq v \leq 5.5$, and $x+y+z+w+v=100$.

According to yet another aspect of an exemplary embodiment, the present disclosure provides a method of manufacturing amorphous metal flakes, including: forming an amorphous metal thin film on a base substrate by sputtering using a an amorphous aluminum alloy target made of a material represented by a formula $Al_xNi_zY_wCo_v$; and separating the amorphous metal thin film from the base substrate. Here, x, y, z, w, and v denote an atomic ratio, and $77.5 \leq x \leq 90.0$, $1.0 \leq z \leq 7.0$, $2.0 \leq w \leq 10.0$, $0.0 \leq v \leq 5.5$, and $x+y+z+w+v=100$.

The operation of forming the amorphous metal thin film may include: preparing an amorphous aluminum alloy powder having a composition of the formula; and agglomerating the amorphous aluminum alloy powder to prepare the amorphous aluminum alloy target for use in the sputtering.

The operation of preparing the amorphous aluminum alloy powder may include: introducing raw materials having the atomic ratio of the formula into an atomizer, melting the raw materials, and making a hardened material into powder.

The operation of forming the amorphous metal thin film may further include: forming a sacrificial layer of a plastic material on a base substrate; and forming the amorphous metal thin film on the sacrificial layer by sputtering using the amorphous aluminum alloy target. When the amorphous metal thin film is separated from the base substrate, the amorphous metal thin film may be separated from the sacrificial layer.

The method of manufacturing amorphous metal flakes may further include: crushing a separated amorphous metal thin film to obtain the amorphous metal flakes.

The separated amorphous metal thin film may be crushed through an ultrasonic treatment.

The operation of forming the amorphous metal thin film further include: forming a sacrificial layer of a plastic material on a base substrate; forming a photosensitive film pattern on the sacrificial layer; and forming the amorphous metal thin film on the photosensitive film pattern by sputtering using the amorphous aluminum alloy target.

The photosensitive film pattern may have a pattern size corresponding to sizes of the amorphous metal particles to be manufactured.

When the amorphous metal thin film is separated from the base substrate, the amorphous metal thin film on the photoresist film pattern is obtained as the amorphous metal flakes while the photoresist film pattern is removed.

According to an aspect of another exemplary embodiment, the present disclosure provides an amorphous metal particle represented by a formula $Al_xLi_yNi_zY_wCo_v$. Here, x, y, z, w, and v denote an atomic ratio, and $75.0 \leq x \leq 90.0$, $3.0 < y \leq 7.0$, $1.0 \leq z \leq 7.0$, $2.0 \leq w \leq 10.0$, $0.0 \leq v \leq 5.5$, and $x+y+z+w+v=100$.

The amorphous metal particle may have a shape of a flake or a tube.

The thickness of the amorphous metal particle may be in a range of 20 nm to 1000 nm.

According to another aspect of another exemplary embodiment, the present disclosure provides a conductive ink comprising amorphous metal particles represented by a formula $Al_xLi_yNi_zY_wCo_v$. Here, x, y, z, w, and v denote an atomic ratio, and $75.0 \leq x \leq 90.0$, $3.0 < y \leq 7.0$, $1.0 \leq z \leq 7.0$, $2.0 \leq w \leq 10.0$, $0.0 \leq v \leq 5.5$, and $x+y+z+w+v=100$.

According to yet another aspect of another exemplary embodiment, the present disclosure provides a cathode for an OLED display device formed by printing a conductive ink comprising amorphous metal particles represented by a formula $Al_xLi_yNi_zY_wCo_v$. Here, x, y, z, w, and v denote an atomic ratio, and $75.0 \leq x \leq 90.0$, $3.0 < y \leq 7.0$, $1.0 \leq z \leq 7.0$, $2.0 \leq w \leq 10.0$, $0.0 \leq v \leq 5.5$, and $x+y+z+w+v=100$.

In case that the OLED display device is a top emitting device, thicknesses of the amorphous metal particles may be in a range of 20 nm to 80 nm.

In case that the OLED display device is a bottom emitting device, thicknesses of the amorphous metal particles may be in a range of 100 nm to 1000 nm.

According to still yet another aspect of another exemplary embodiment, the present disclosure provides a method of manufacturing amorphous metal particles, including: forming an amorphous metal thin film on a base substrate by sputtering using a an amorphous aluminum alloy target made of a material represented by a formula $Al_xLi_yNi_zY_wCo_v$; and separating the amorphous metal thin film from the base substrate. Here, x, y, z, w, and v denote an atomic ratio, and $75.0 \leq x \leq 90.0$, $3.0 < y \leq 7.0$, $1.0 \leq z \leq 7.0$, $2.0 \leq w \leq 10.0$, $0.0 \leq v \leq 5.5$, and $x+y+z+w+v=100$.

According to the present disclosure, the amorphous metal particles may be manufactured based on the amorphous aluminum alloy, and may provide excellent oxidation resistance even though the flakes do not contain precious metals such as silver and gold. That is, the amorphous metal particles according to the present disclosure may be made of an alloy material containing a main component of aluminum as well as Ni, Y, or Co, and may show the excellent oxidation resistance even though they are based on aluminum because they have the amorphous structure rather than a crystalline structure contrary to the conventionally-used metals.

Also, according to the present disclosure, the amorphous metal particles may be manufactured based on lithium-containing amorphous aluminum alloy, and may show low work function and excellent oxidation resistance even though the particles do not contain precious metals such as silver and gold. That is, the amorphous metal particles to the present disclosure may be made of an alloy material containing a main component of Al as well as Li and further containing Ni, Y, or Co, and may show the properties of the low work function and the excellent oxidation resistance even though they are based on aluminum because they have the amorphous structure rather than a crystalline structure contrary to the conventionally-used metals.

The conductive ink containing the amorphous metal particles according to the present disclosure can provide the excellent electrical conductivity even in a printed state since the amorphous metal particles do not undergo oxidation even in a dispersed environment in the conductive ink and under an elevated temperature process condition. Since the amorphous metal particles according to the present disclosure show the excellent oxidation resistance, the amorphous metal particles can stably go through all the relevant processes without a separate and additional coating on the outside of the amorphous metal flakes, and can be used in the manufacture of the conductive ink that can print a metal thin film showing excellent electrical conductivity.

The amorphous metal particles according to the present disclosure exhibit good optical properties such as reflectance and transparence required by the cathode of the OLED display device due to the flake shape.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings.

Figure 1:
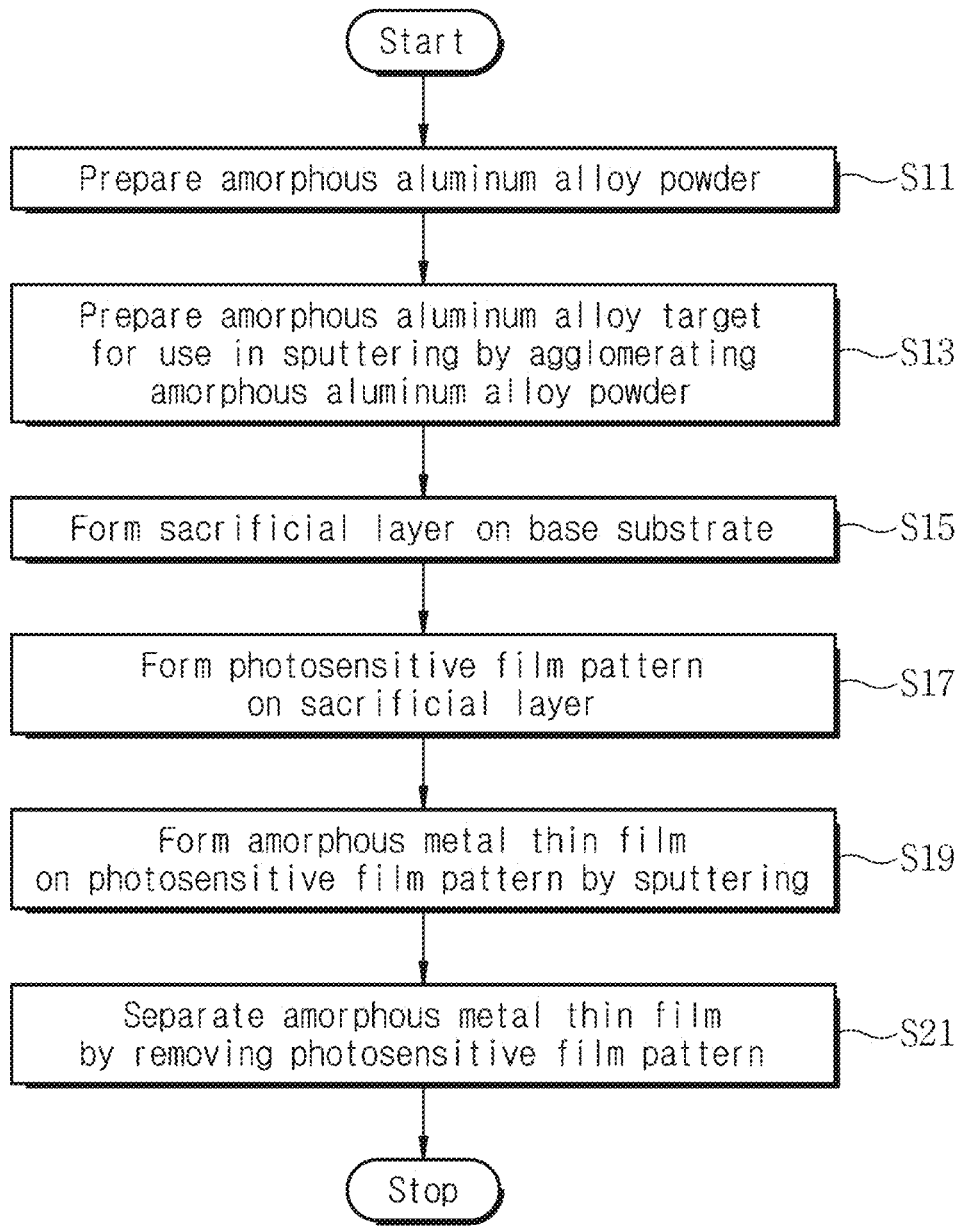
FIG. 1 is a flowchart illustrating a first embodiment of a method of manufacturing amorphous metal flakes according to the present disclosure.

The drawings described herein are for illustration purposes only and are not intended to limit the scope of the present disclosure in any way.

DETAILED DESCRIPTION

In the following description and the accompanied drawings, only parts necessary for understanding embodiments of the present disclosure will be described, and detailed descriptions of well-known functions or configuration that may obscure the subject matter of the present disclosure will be omitted for simplicity.

The terms and words used in the following description and appended claims are not necessarily to be construed in an ordinary sense or a dictionary meaning, and may be appropriately defined herein to be used as terms for describing the present disclosure in the best way possible. Such terms and words should be construed as meaning and concept consistent with the technical idea of the present disclosure. The embodiments described in this specification and the configurations shown in the drawings are merely preferred embodiments of the present disclosure are not intended to limit the technical idea of the present disclosure. Therefore, it should be understood that there may exist various equivalents and modifications which may substitute the exemplary embodiments at the time of filing of the present application.

Hereinbelow, exemplary embodiments of the present disclosure will be described in detail with reference to the accompanied drawings.

The aluminum-based amorphous metal particles according to the present disclosure are represented by Formula 1, In Formula 1, x, y, z, w, and v denote an atomic ratio of elements, and x+y+z+w+v=100.

$Al_xLi_yNi_zY_wCo_v$ (Formula 1)

In the aluminum-based amorphous metal particles according to the present disclosure, the aluminum-based amorphous metal particles may be represented by Formula 2 or Formula 3 depending on whether lithium is included, which is described below in detail. Specifically, Formula 2 represents a case where lithium is not included, and Formula 3 represents a case where lithium is included.

Aluminum-Based Amorphous Metal Flakes

An amorphous metal flakes according to the present disclosure are flake-type metal particles that are based on aluminum and have an amorphous structure, and may be used as a material for a conductive ink. The amorphous metal flakes according to the disclosure do not contain lithium.

The amorphous metal flakes according to the present disclosure can be prepared by forming a composition of an amorphous aluminum alloy which may have the amorphous structure, preparing an amorphous metal thin film with the composition, and flaking the amorphous metal thin film.

When aluminum is alloyed with nickel (Ni), yttrium (Y), and cobalt (Co) in a specific composition range, the alloy exhibits properties of an amorphous phase material. That is, the amorphous aluminum alloy has properties that do not appear in general crystalline metals. In particular, because of the absence of crystalline structure or grain boundaries, growth of the oxide film is suppressed in the amorphous aluminum alloy, and the amorphous aluminum alloy has excellent oxidation resistance.

The amorphous aluminum alloy according to the present disclosure may be represented by Formula 2. In Formula 2, x, z, w, and v represent an atomic ratio, and $77.5 \leq x \leq 90.0$, $1.0 \leq z \leq 7.0$, $2.0 \leq w \leq 10.0$ and $0.0 \leq v \leq 5.5$. In Formula 2, $x+z+w+v=100$.

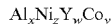  (Formula 2)

The amorphous metal flakes according to the present disclosure manufactured based on the amorphous aluminum alloy may provide excellent oxidation resistance even though the flakes do not contain precious metals such as silver and gold. That is, the amorphous metal flakes according to the present disclosure, which are made of an alloy material containing a main component of aluminum as well as Ni, Y, or Co, show the excellent oxidation resistance even though they are based on aluminum because they have the amorphous structure rather than a crystalline structure contrary to the conventionally-used metals.

In addition, the conductive ink containing the amorphous metal flakes according to the present disclosure can provide the excellent electrical conductivity even in a printed state since the amorphous metal flakes do not undergo oxidation even in a dispersed environment in the conductive ink and under an elevated temperature process condition. Since the amorphous metal flakes according to the present disclosure show the excellent oxidation resistance, the amorphous metal flakes can stably go through all the relevant processes without a separate and additional coating on the outside of the amorphous metal flakes, and can be used in the manufacture of the conductive ink that can print a metal thin film showing excellent electrical conductivity.

Method of Manufacturing Amorphous Metal Flakes

The manufacturing method of the amorphous metal flakes according to the present disclosure will now be described with reference to FIGS. 1 to 7.

First Embodiment of Manufacturing Method

FIG. 1 is a flowchart illustrating a first embodiment of a method of manufacturing the amorphous metal flakes according to the present disclosure. FIGS. 2-6 are views illustrating each step in the manufacturing method of FIG. 1.

Referring to FIGS. 1-6, according to the first embodiment, the amorphous metal flakes 80 are manufactured using a photosensitive film pattern 50.

First, in step S11, the amorphous aluminum alloy powder having a composition represented by Formula 2 is prepared. That is, raw materials having the atomic ratio of Formula 2 are introduced into an atomizer, melted, and powdered to prepare the amorphous aluminum alloy powder.

Next, in step S13, the amorphous aluminum alloy powder is agglomerated to prepare an amorphous aluminum alloy target for use in sputtering. That is, the amorphous aluminum alloy target for use in sputtering is prepared by introducing the amorphous aluminum alloy powder into a target preparation container and then applying pressure to agglomerate the powder in the target preparation container.

Figure 2:
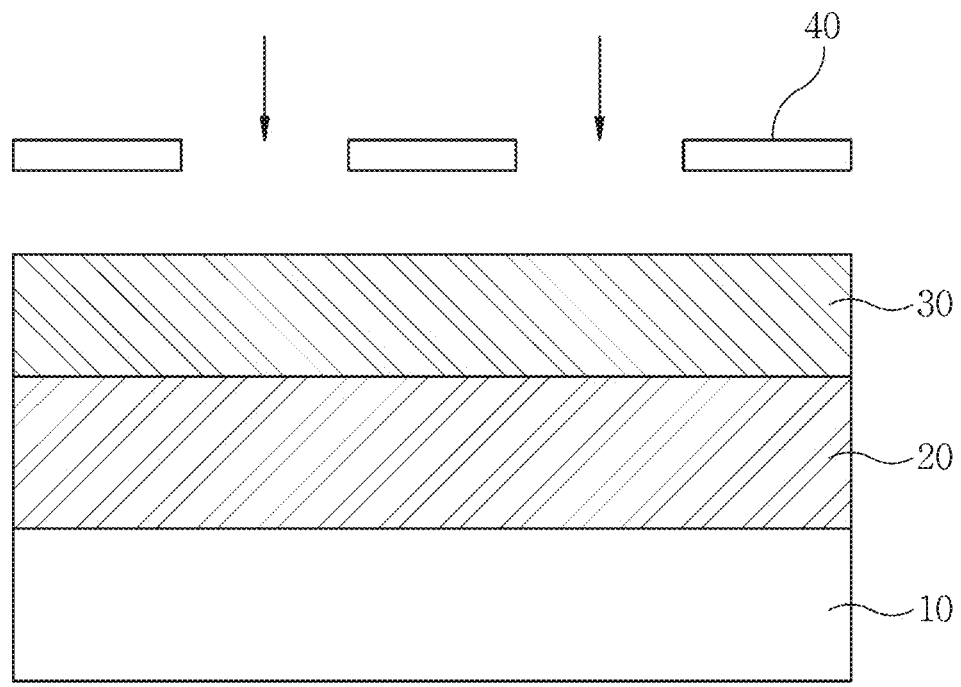
FIGS. 2 through 6 are views illustrating each step in the manufacturing method of FIG. 1.

Next, as shown in FIG. 2, a sacrificial layer 20 is formed on a base substrate 10 in step S15. The sacrificial layer 20 is formed on the base substrate 10 to facilitate a separation of an amorphous metal thin film to be formed by sputtering on the base substrate 10 from a photosensitive film 30.

The base substrate 10 may be a glass substrate, a plastic substrate, or a ceramic substrate. Materials for the plastic substrate may include polyimide, polyethersulphone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA), or cellulose acetate propionate (CAP), but the present disclosure is not limited thereto.

Meanwhile, a material for the sacrificial layer 20 may include a polymer that is easily soluble in a solvent. For example, Poly(methyl methacrylate) (PMMA) may be used for the sacrificial layer 20, but the present disclosure is not limited thereto. As the solvent, one capable of simultaneously removing the sacrificial layer 20 and the photosensitive film 30 may be used.

Figure 3:
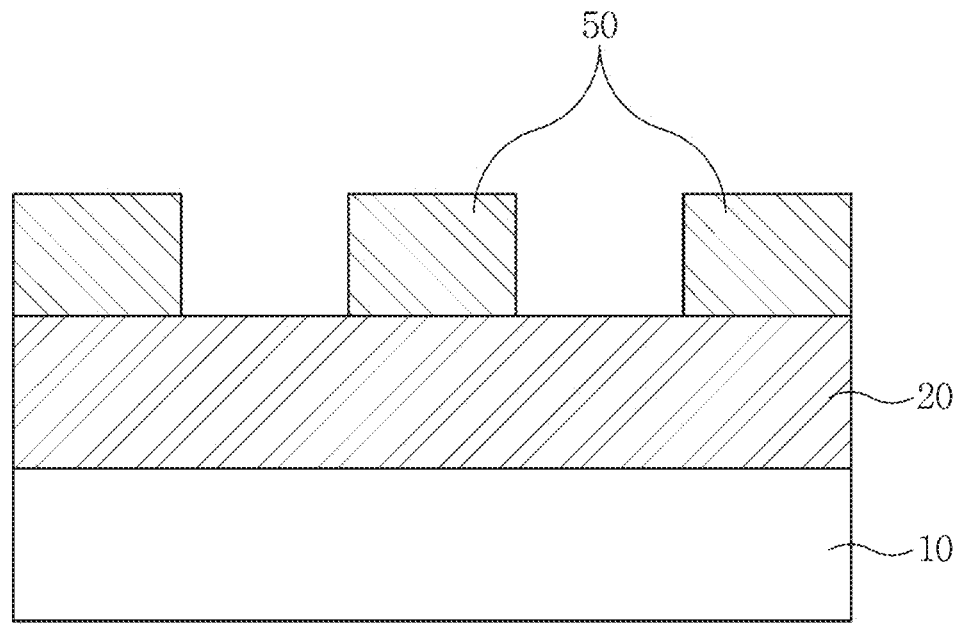
Figure 4:
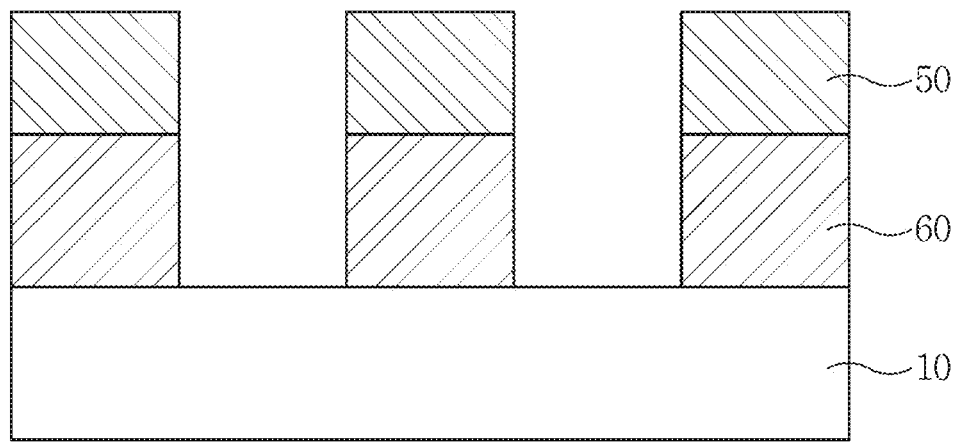

Next, as shown in FIGS. 2-4, a photosensitive film pattern 50 is formed on the sacrificial layer 20 in step S17. First, as shown in FIG. 2, a photosensitive agent is applied on the sacrificial layer 20 to form the photosensitive film 30. Subsequently, as shown in FIGS. 2 and 3, the photosensitive film 30 is selectively exposed to light using a mask 40. Then, as shown in FIGS. 3 and 4, the photosensitive film 30 is selectively removed to form the photosensitive film pattern 50. At this time, a sacrificial layer pattern 60 corresponding to the photosensitive film pattern 50 may be formed by selectively removing the sacrificial layer 20 according to the photosensitive film pattern 50. In other words, the photosensitive film 30 and the sacrificial layer 20 in portions exposed to light through the mask 40 may be removed in a single step to form the photosensitive film pattern 50 and the sacrificial layer pattern 60 at the same time.

At this time, the photosensitive film pattern 50 is formed to have a size corresponding to the size of the amorphous metal flake to be manufactured. Thus, the size of the amorphous metal flakes to be manufactured may be changed through a patterning of the photosensitive film 30 or the mask 40.

Figure 5:
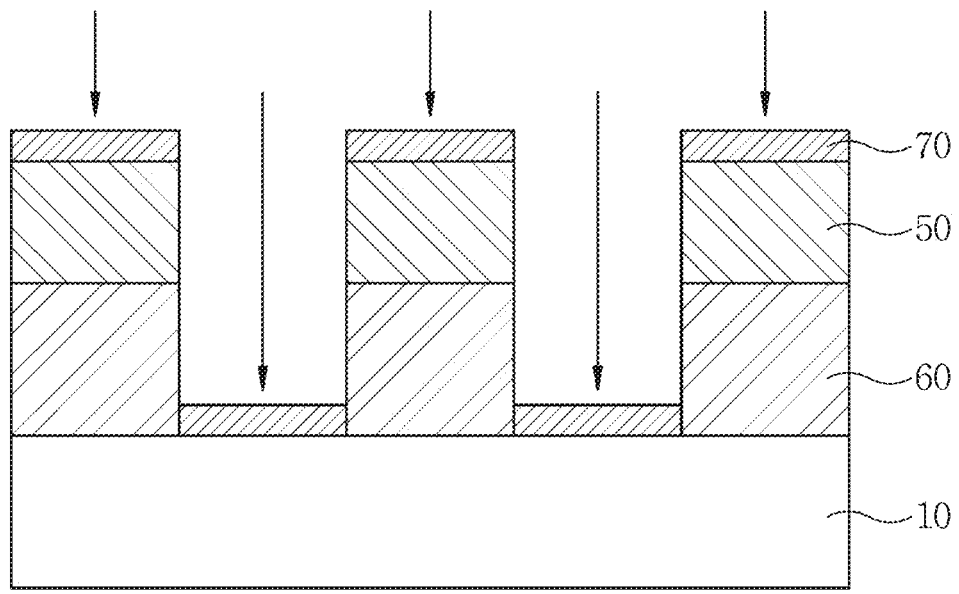

Afterwards, as shown in FIG. 5, an amorphous metal thin film 70 is formed on the photosensitive film pattern 50, in step S19, by the sputtering that uses the amorphous aluminum alloy target. At this time, the amorphous metal thin film 70 may be deposited on the photosensitive film pattern 50 as well as a portion of the base substrate 10 exposed between adjacent photosensitive film patterns 50.

Figure 6:
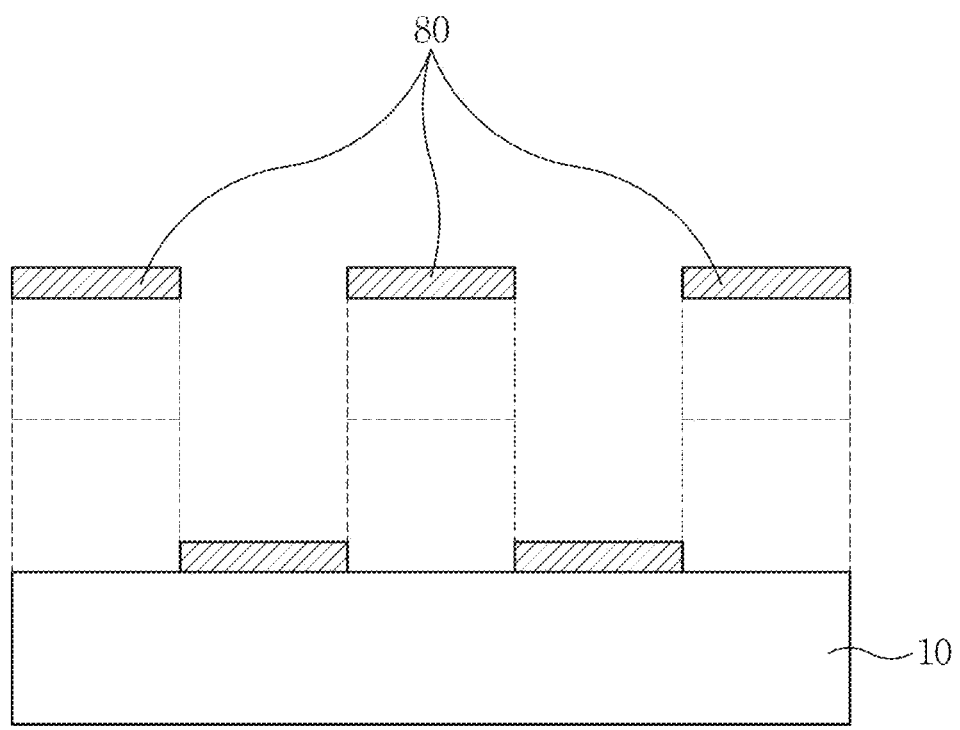

Then, as shown in FIGS. 5 and 6, the photosensitive film pattern 50 is removed to separate the amorphous metal thin film 70 in step S21. The amorphous metal thin film 70 on the photosensitive film pattern 50 can be separated easily by dissolving the photosensitive film pattern 50 with the solvent. The amorphous metal thin film 70 separated as above is the amorphous metal flakes 80.

Second Embodiment of Manufacturing Method

Though the amorphous metal flakes were manufactured using the photosensitive film pattern in the first embodiment described above, the present disclosure is not limited thereto. For example, as shown in FIG. 7, the amorphous metal flakes may be manufactured through a crushing process instead of using the photosensitive film pattern.

Figure 7:
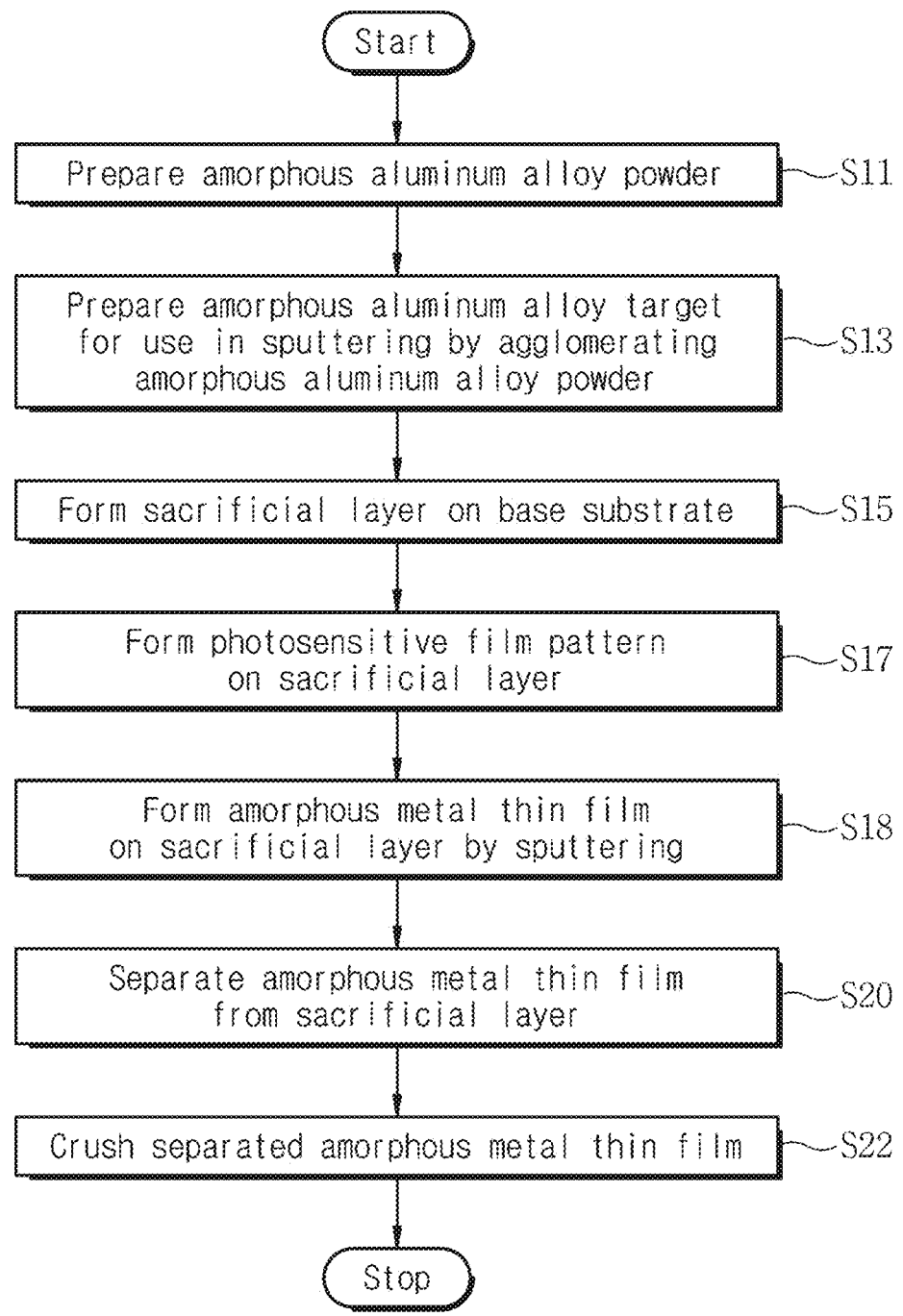
FIG. 7 is a flowchart illustrating a second embodiment of a method of manufacturing amorphous metal flakes according to the present disclosure.

FIG. 7 is a flowchart illustrating a second embodiment of the method of manufacturing amorphous metal flakes according to the present disclosure.

Steps S11 through S15 of the method of manufacturing the amorphous metal flakes according to the second embodiment shown in FIG. 7 may be are performed in the same manner as corresponding steps in the first embodiment shown in FIG. 1, and detailed description thereof will be omitted for simplicity.

In step S18, the amorphous metal thin film is formed on the sacrificial layer by the sputtering that uses the amorphous aluminum alloy target. At this time, the amorphous metal thin film is formed on an entire surface of the sacrificial layer.

Subsequently, the amorphous metal thin film is separated from the sacrificial layer in step S20. The amorphous metal thin film can be separated from the base substrate by dissolving and removing the sacrificial layer with the solvent. For example, if the base substrate on which the amorphous metal thin film is formed is introduced into a solution tank containing the solvent capable of dissolving the sacrificial layer, the sacrificial layer is dissolved by the solvent. As a result, the amorphous metal thin film may be separated from the base substrate.

In step S22, the amorphous metal flakes according to the present disclosure may be obtained by crushing the amorphous metal thin film separated in the step S20. At this time, the amorphous metal thin film separated in the step 320 may be crushed through an ultrasonic treatment, and obtained amorphous metal flakes may have random sizes and shapes.

The amorphous metal flakes manufactured according to the first embodiment have a regular size and shape since the amorphous metal flakes are manufactured by using the photosensitive film pattern. However, the amorphous metal flakes manufactured according to the second embodiment have random sizes and shapes because the flakes are obtained by crushing a wide amorphous metal thin film.

The amorphous metal flakes manufactured as above may be used as one of ingredients of the conductive ink.

Example 1 and Comparative Example 1

In order to evaluate the oxidation resistance and electrical conductivity of the amorphous metal flakes manufactured according to the manufacturing method of the present disclosure, the amorphous metal thin film and the amorphous metal flakes were manufactured according to the manufacturing method of the second embodiment.

In Example 1, an amorphous aluminum alloy target for use in sputtering was prepared using an amorphous aluminum alloy having an atomic ratio of x=85, z=5, w=8, and v=2 in Formula 2. A glass substrate was used as the base substrate and PMMA was used for the sacrificial layer.

Comparative Evaluation of Amorphous Structure

First, an amorphousness according to the thickness of the metal thin film formed on the base substrate by the sputtering was evaluated.

Figure 8:
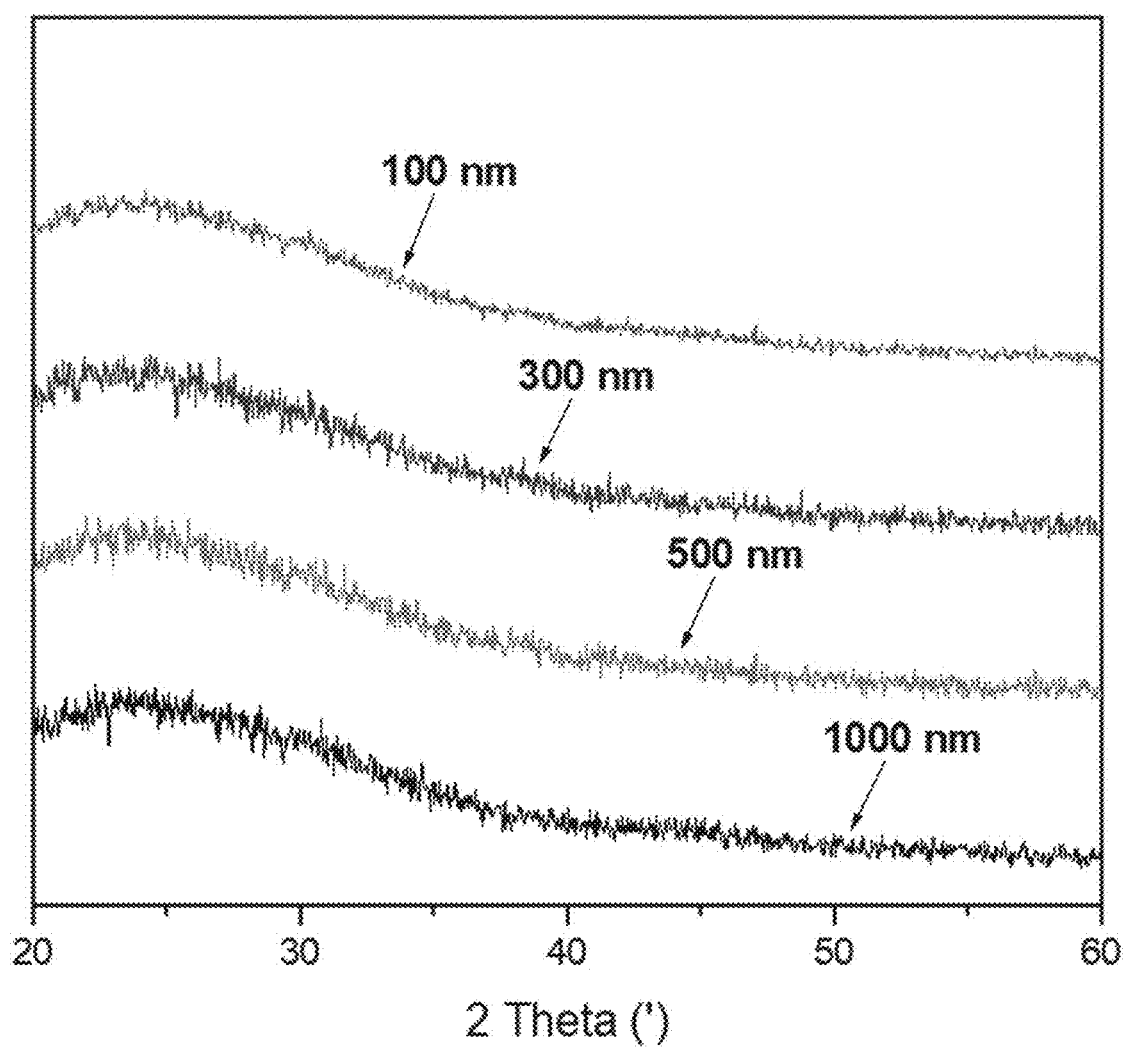
FIG. 8 is a graph illustrating results of X-ray diffraction analyses for aluminum-based amorphous metal thin films, of several thicknesses, manufactured by sputtering.

FIG. 8 is a graph illustrating results of X-ray diffraction analyses for the aluminum-based amorphous metal thin films, of several thicknesses, manufactured by sputtering.

Referring to FIG. 8, the metal thin films were deposited to a thicknesses of 100 nm, 300 nm, 500 nm, and 1000 nm on the sacrificial layer of the base substrate by sputtering using the amorphous aluminum alloy target prepared according to Example 1.

The X-ray diffraction analyses revealed that the metal thin films deposited on the base substrate at the thicknesses of 100 nm to 1000 nm were the amorphous metal thin film having the amorphous structure.

Figure 9:
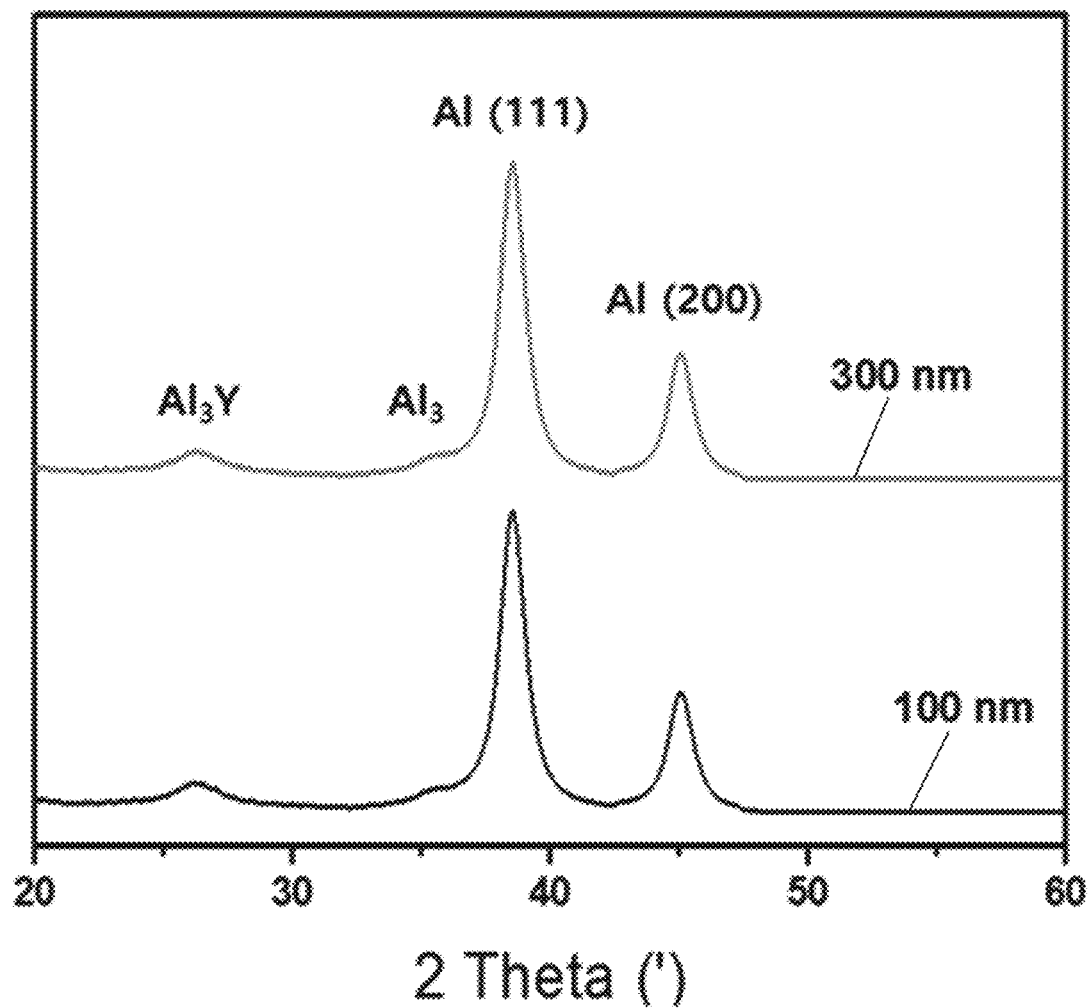
FIG. 9 is a graph illustrating results of X-ray diffraction analyses for an aluminum-based crystalline metal thin film.
Figure 10:
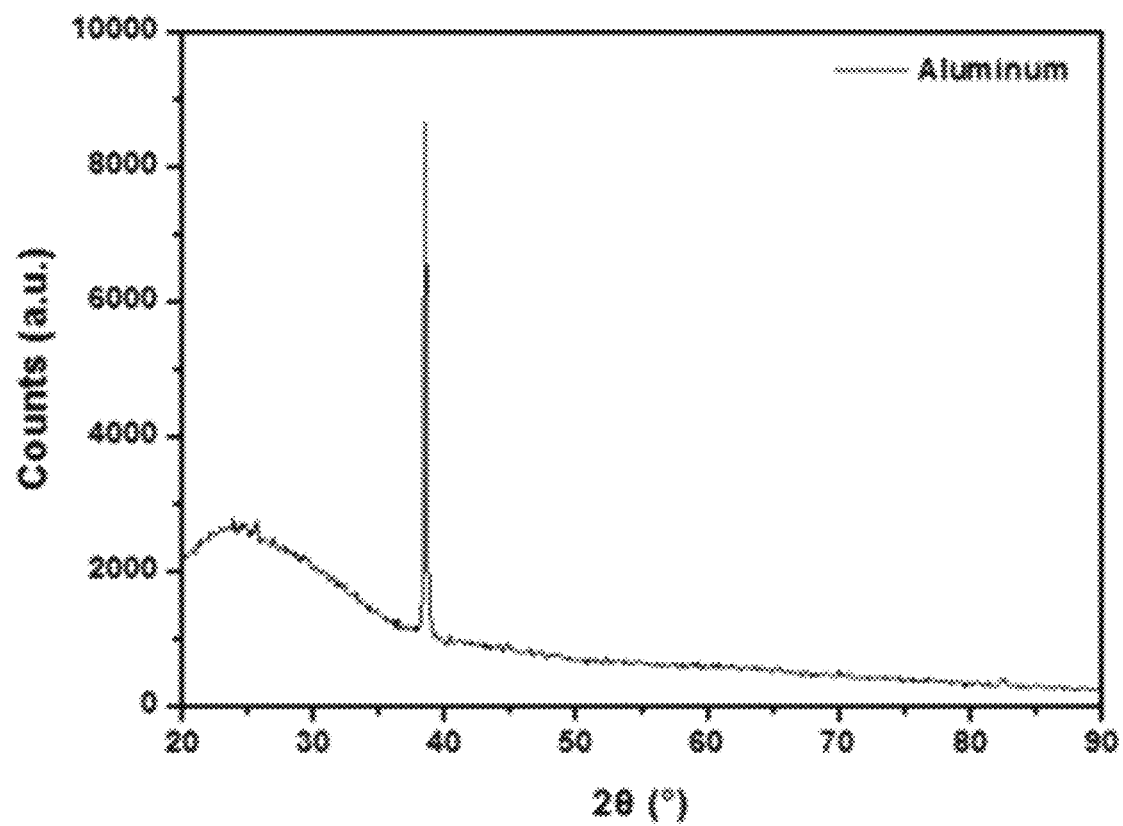
FIG. 10 is a graph illustrating a result of an X-ray diffraction analysis for an aluminum thin film.

In case that the deposited metal thin film was formed to have the crystalline structure, for example, rather than the amorphous structure due to a compositional or process problem, the X-ray diffraction analyses would show diffraction patterns having at least one peak such as those shown in FIGS. 9 and 10. Here, FIG. 9 is a graph illustrating results of X-ray diffraction analyses for an aluminum-based crystalline metal thin film, and FIG. 10 is a graph illustrating a result of an X-ray diffraction analysis for an aluminum thin film.

A comparison of the X-ray diffraction analyses of FIGS. 8 to 10 shows that the metal thin film manufactured according to Example 1 exhibits a property of a material having the amorphous structure.

Comparative Evaluation of Oxidation Resistance

In order to compare and evaluate the oxidation resistance of a crystalline aluminum thin film according to a Comparative Example 1 and the amorphous metal thin film according to Example 1 having the thickness of 100 nm, the films were exposed to a high temperature and high humidity environment and then respective changes in a sheet resistance were measured.

Figure 11A:
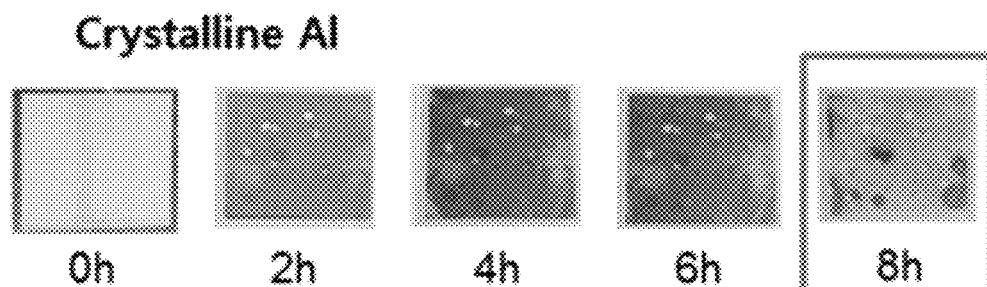
FIG. 11A and FIG. 11B summarize photographs showing a result of a comparative evaluation of oxidation resistances of metal thin films according to Comparative Example 1 and Example 1.
Figure 11B:
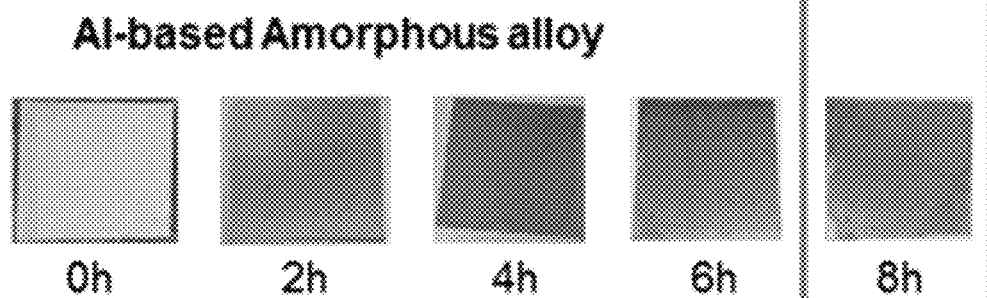

FIG. 11A and FIG. 11B summarize photographs showing a result of a comparative evaluation of oxidation resistances of the metal thin films according to Comparative Example 1 and Example 1.

It can be seen, in FIG. 11A, that the crystalline aluminum thin film according to the Comparative Example 1 was rapidly oxidized after 2 hours and most of the thin film was oxidized or disappeared after 8 hours.

It can be seen, in FIG. 11B, that the amorphous metal thin film according to the Embodiment was partially oxidized in some localized portions but the oxidized portions did not grow any further and the oxidation progress stopped.

TABLE 1

|  | 0 h | 2 h | 4 h | 6 h | 8 h |
| --- | --- | --- | --- | --- | --- |
| Comparative Example 1 | 1.79 | 3.54 | 4.42 | 5.46 | 487 (increased by 271%) |
| Example 1 | 7.06 | 7.39 | 8.23 | 9.89 | 10.07 (increased by 42.6%) |

It is observed, in Table 1, that the sheet resistance of the crystalline aluminum thin film according to Comparative Example 1 increased drastically, i.e. by 271%, after 8 hours. Contrarily, the sheet resistance of the amorphous metal thin film according to Example 1 increased slightly, i.e. by 10.07%, after 8 hours. Thus, it can be concluded that the amorphous metal thin film according to Example 1 has excellent oxidation resistance.

Observation of Shapes of Flakes

Amorphous metal flakes was manufactured by the manufacturing method of the second embodiment from the amorphous metal thin film according to the Example 1.

Figure 12:
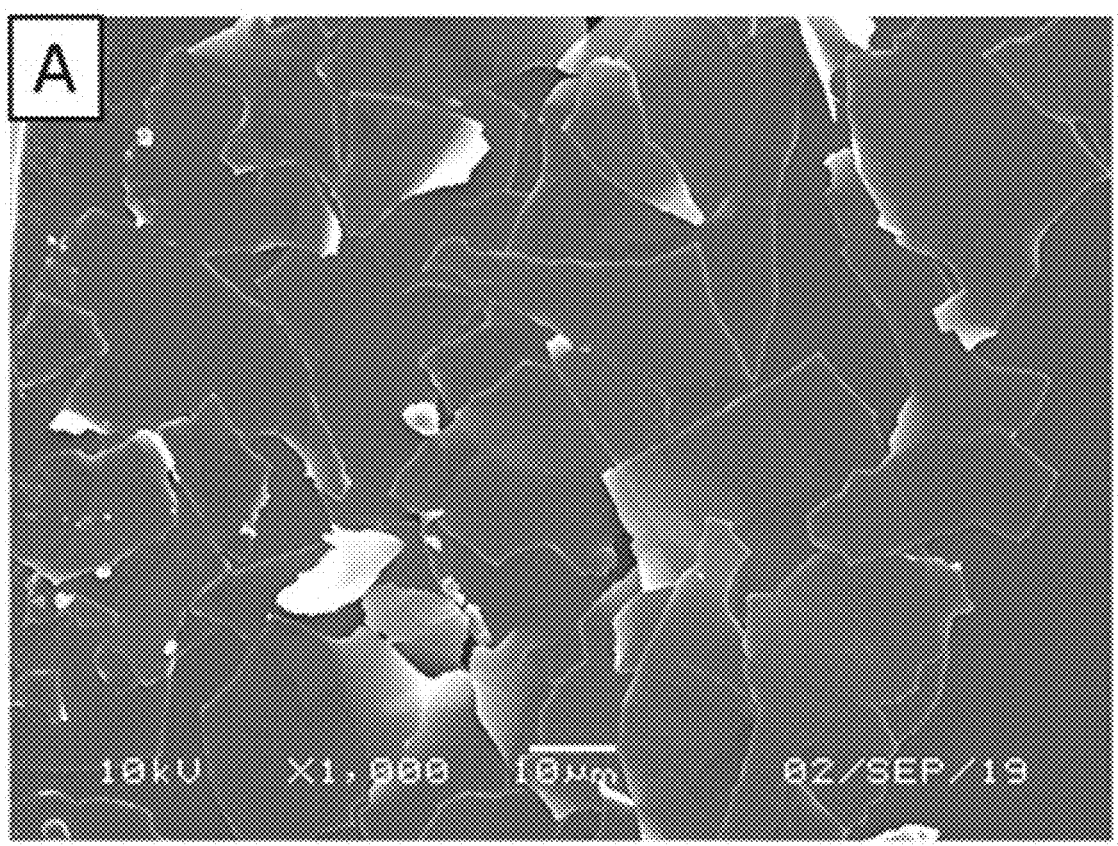
FIG. 12 is a scanning electron microscope (SEM) image of amorphous metal flakes according to Example 1.
Figure 13:
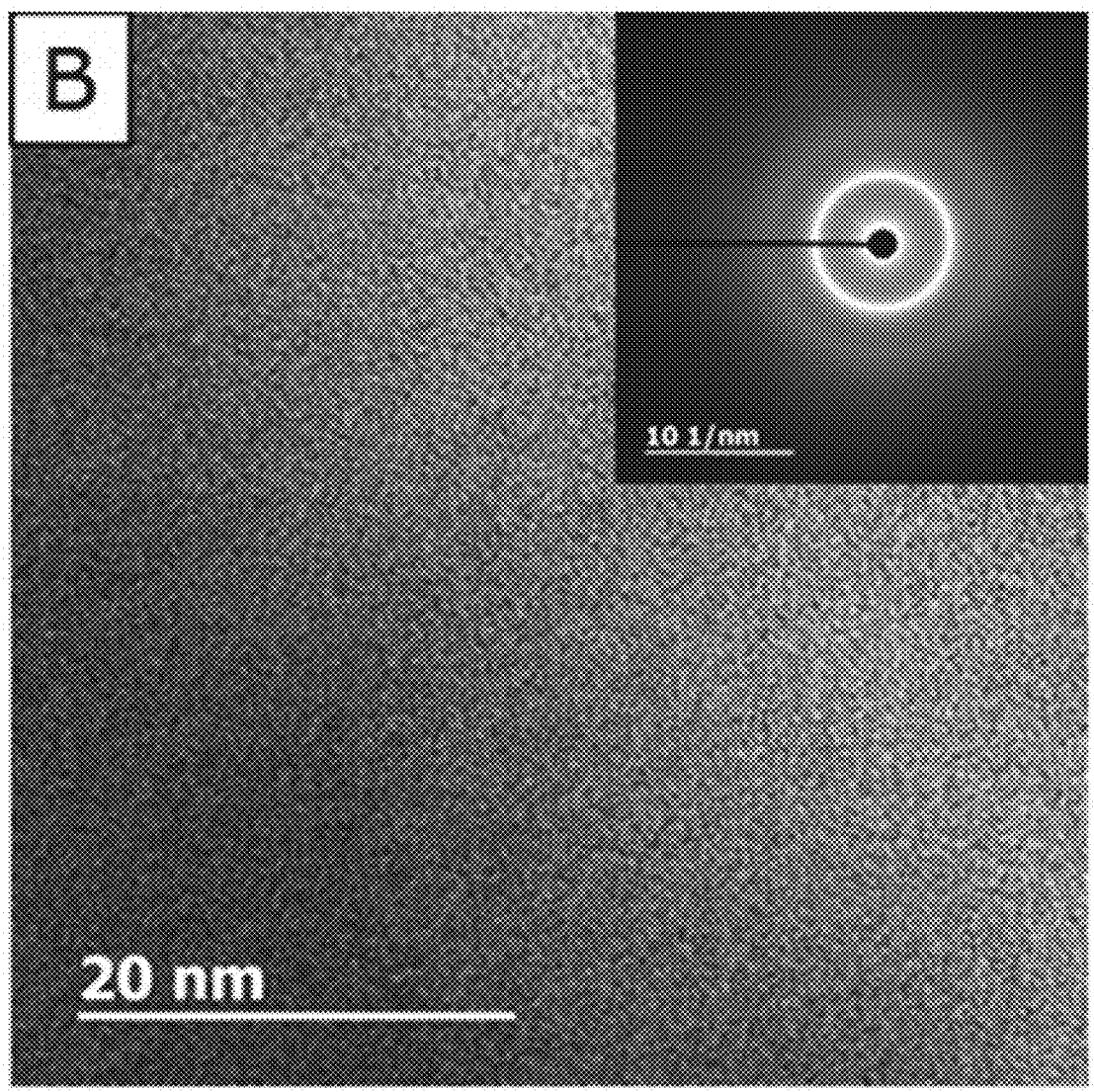
FIG. 13 is a high-resolution transmission electron microscopy (HRTEM) image and a selected area diffraction patterns (SADP) analysis image of amorphous metal flakes according to Example 1.

FIG. 12 is a scanning electron microscope (SEM) image of the amorphous metal flakes according to Example 1. FIG. 13 is a high-resolution transmission electron microscopy (HRTEM) image and a selected area diffraction patterns (SADP) analysis image of the amorphous metal flakes according to Example 1.

Referring to FIGS. 12 and 13, it can be easily observed that the amorphous metal flakes according to Example 1 were manufactured to have random shapes. Also, it is observed that an amorphous SADP appears without any periodic lattice fringe in the HRTEM image for the amorphous metal flakes according to Example 1.

Aluminum-Based Amorphous Metal Particles Containing Lithium

Amorphous metal particles according to the present disclosure are metal particles that are based on aluminum and have the amorphous structure, and may have shapes of flakes or tubes.

The amorphous metal particles according to the present disclosure may have a thickness of 20 nm to 1000 nm.

The amorphous metal particles according to the present disclosure can be used as a material for the conductive ink, which may be used to manufacture a cathode of an OLED through a printing process.

The amorphous metal particles according to the present disclosure can be prepared by forming a composition of an amorphous aluminum alloy which may have the amorphous structure, preparing an amorphous metal thin film with the composition, and flaking or tubing the amorphous metal thin film.

When aluminum is alloyed with nickel, yttrium, and cobalt in a specific composition range, the alloy exhibits properties of an amorphous phase material. That is, the lithium-containing amorphous aluminum alloy (hereinbelow, referred to as 'amorphous aluminum alloy') has properties that do not appear in general crystalline metals. In particular, because of the absence of crystalline structure or grain boundaries, growth of the oxide film is suppressed in the amorphous aluminum alloy, and the amorphous aluminum alloy has excellent oxidation resistance.

The amorphous aluminum alloy according to the present disclosure may be represented by Formula 3. In Formula 3, x, y, z, w, and v denote an atomic ratio, and $77.5 \leq x \leq 90.0$, $0.0 < y \leq 7.0$, $1.0 \leq z \leq 7.0$, $2.0 \leq w \leq 10.0$ and $0.0 \leq v \leq 5.5$, In Formula 3, $x+y+z+w+v=100$. Here, the atomic ratio of lithium may be in a range of $3.0 < y \leq 7.0$ in consideration of its low work function and good oxidation resistance.

$$Al_xLi_yNi_zY_wCo_v \qquad \text{(Formula 3)}$$

The amorphous metal particles according to the present disclosure manufactured based on the amorphous aluminum alloy may provide excellent oxidation resistance even though the flakes do not contain precious metals such as silver and gold. That is, the amorphous metal flakes according to the present disclosure, which are made of an alloy material containing a main component of Al as well as Li and further containing Ni, Y, or Co, show the properties of the low work function and the excellent oxidation resistance even though they are based on aluminum because they have the amorphous structure rather than a crystalline structure contrary to the conventionally-used metals.

In addition, the conductive ink containing the amorphous metal particles according to the present disclosure can provide the excellent electrical conductivity even in a printed state since the amorphous metal particles do not undergo oxidation even in a dispersed environment in the conductive ink and under an elevated temperature process condition. Since the amorphous metal particles according to the present disclosure show the excellent oxidation resistance, the amorphous metal particles can stably go through all the relevant processes without a separate and additional coating on the outside of the amorphous metal flakes, and can be used in the manufacture of the conductive ink that can print a metal thin film showing excellent electrical conductivity.

The amorphous metal particles according to the present disclosure exhibit good optical properties such as reflectance and transparence required by the cathode of the OLED display device due to flake or tube shape.

A top emitting OLED display device requires a property of semi-transmitting light, which can be secured when the thickness of the amorphous metal particles is in a range of 20 nm to 80 nm. At this time, the shape of the amorphous metal particles is preferably the flake type.

A bottom emitting OLED display device requires a property of reflecting light, which can be secured when the thickness of the amorphous metal particles is in a range of 100 nm to 1000 nm. At this time, the shape of the amorphous metal particles is preferably the flake type.

Therefore, the cathode made of the conductive ink containing the amorphous metal particles according to the present disclosure can be applied to both the top emitting and bottom emitting structures.

Method of Manufacturing Amorphous Metal Particles

The manufacturing method of the amorphous metal particles according to the present disclosure will now be described with reference to FIGS. 14 to 21.

First Embodiment of Manufacturing Method

Figure 14:
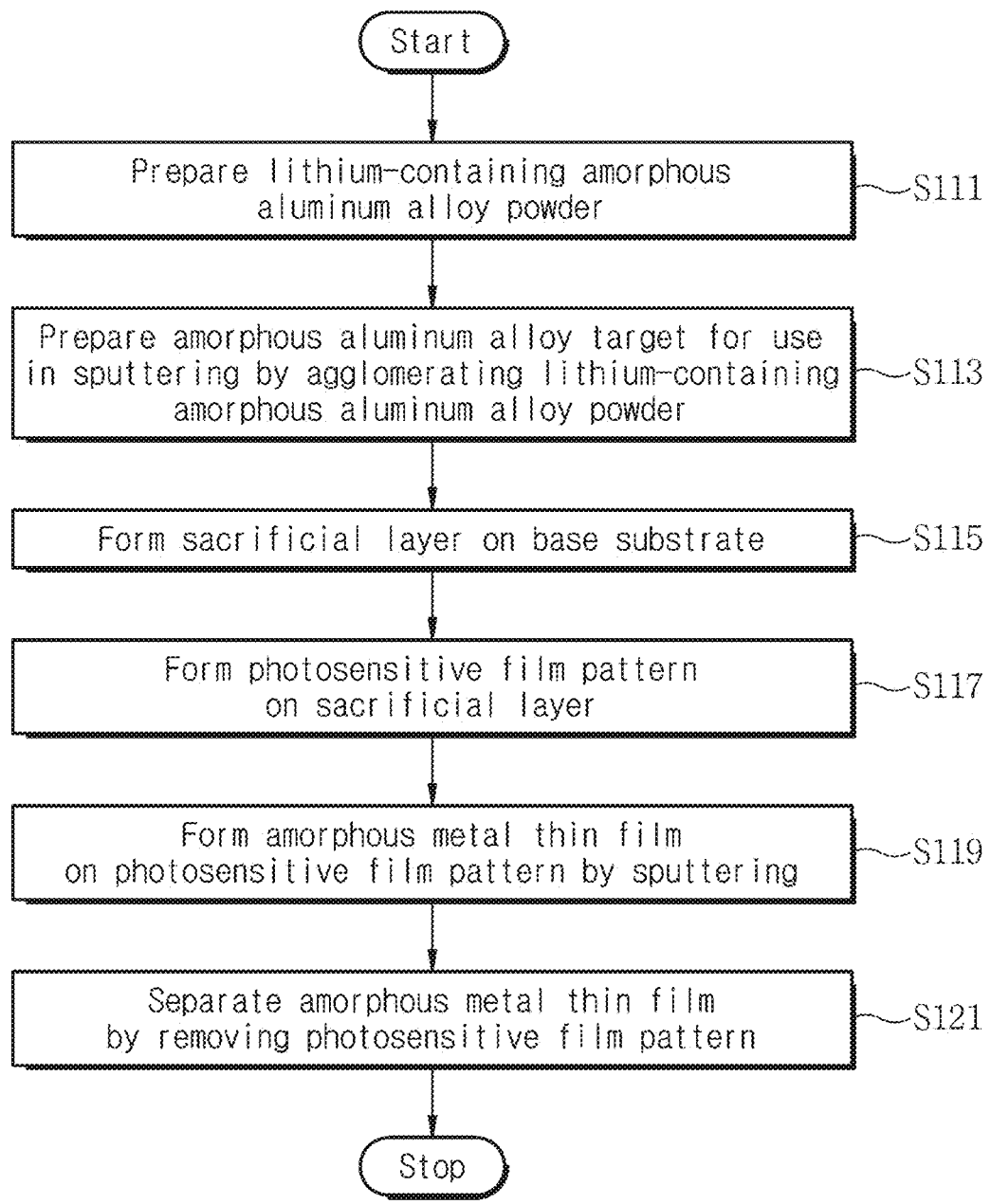
FIG. 14 is a flowchart illustrating a first embodiment of a method of manufacturing amorphous metal particles according to the present disclosure.

FIG. 14 is a flowchart illustrating a first embodiment of a method of manufacturing the amorphous metal particles according to the present disclosure. FIGS. 15-19 are views illustrating each step in the manufacturing method of FIG. 14.

Referring to FIGS. 14-19, the amorphous metal particles 180 are manufactured using a photosensitive film pattern 150 according to the first embodiment.

First, in step S111, lithium-containing amorphous aluminum alloy powder having a composition represented by Formula 3 is prepared. That is, raw materials having the atomic ratio of Formula 3 are introduced into an atomizer, melted, and powdered to prepare the lithium-containing amorphous aluminum alloy powder.

Next, in step S113, the lithium-containing amorphous aluminum alloy powder is agglomerated to prepare an amorphous aluminum alloy target for use in sputtering. That is, the amorphous aluminum alloy target for use in sputtering is prepared by introducing the lithium-containing amorphous aluminum alloy powder into a target preparation container and then applying pressure to agglomerate the powder in the target preparation container.

Figure 15:
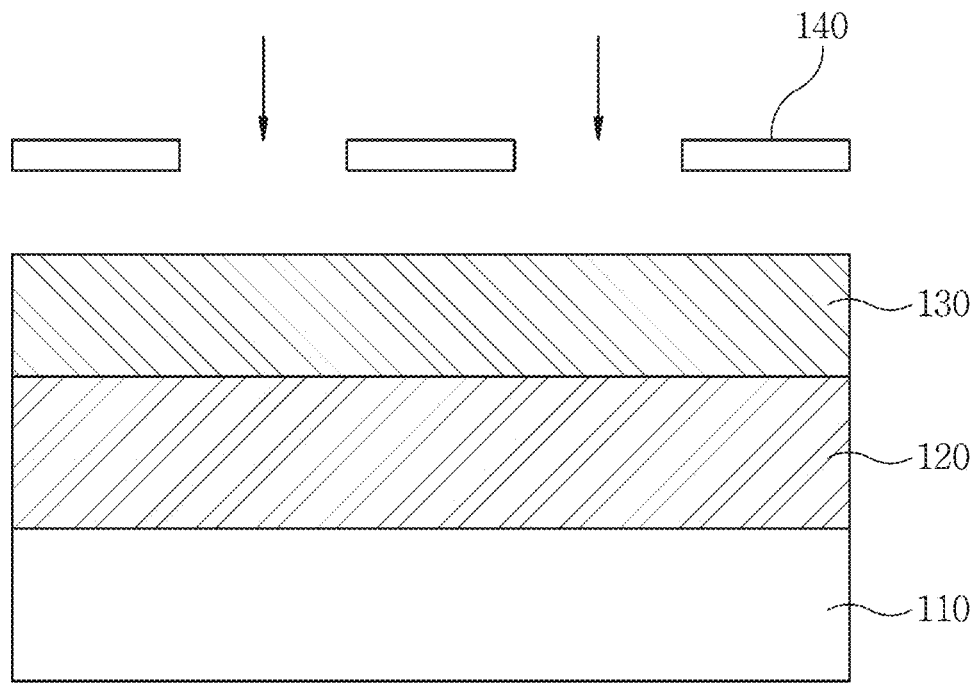
FIGS. 15 through 19 are views illustrating each step in the manufacturing method of FIG. 14.

Next, as shown in FIG. 15, a sacrificial layer 120 is formed on a base substrate 110 in step S115. The sacrificial layer 120 is formed on the base substrate 110 to facilitate a separation of an amorphous metal thin film to be formed by sputtering on the base substrate 110 from a photosensitive film 130.

The base substrate 110 may be the glass substrate, the plastic substrate, or the ceramic substrate. Materials for the plastic substrate may include polyimide, polyethersulphone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA), or cellulose acetate propionate (CAP), but the present disclosure is not limited thereto.

Meanwhile, a material for the sacrificial layer 120 may include a polymer that is easily soluble in a solvent. For example, Poly(methyl methacrylate) (PMMA) may be used for the sacrificial layer 120, but the present disclosure is not limited thereto. As the solvent, one capable of simultaneously removing the sacrificial layer 120 and the photosensitive film 130 may be used.

Figure 16:
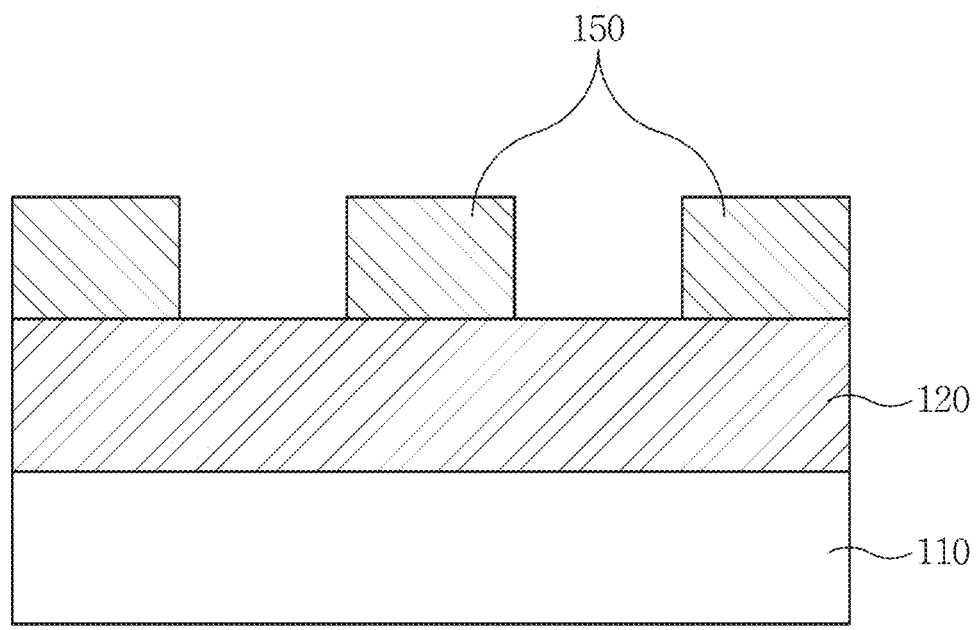
Figure 17:
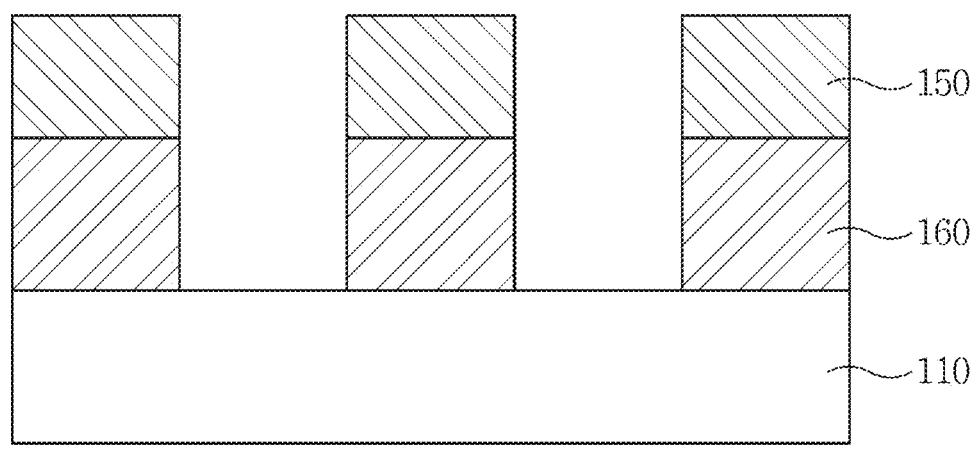

Next, as shown in FIGS. 15-17, a photosensitive film pattern 150 is formed on the sacrificial layer 120 in step S117. First, as shown in FIG. 15, a photosensitive agent is applied on the sacrificial layer 120 to form the photosensitive film 130. Subsequently, as shown in FIGS. 15 and 16, the photosensitive film 130 is selectively exposed to light using a mask 140. Then, as shown in FIGS. 16 and 17, the photosensitive film 130 is selectively removed to form the photosensitive film pattern 150. At this time, a sacrificial layer pattern 160 corresponding to the photosensitive film pattern 150 may be formed by selectively removing the sacrificial layer 120 according to the photosensitive film pattern 150. In other words, the photosensitive film 130 and the sacrificial layer 120 in portions exposed to light through the mask 40 may be removed in a single step to form the photosensitive film pattern 150 and the sacrificial layer pattern 160 at the same time.

At this time, the photosensitive film pattern 150 is formed to have a size corresponding to the size of the amorphous metal particles to be manufactured. Thus, the size of the amorphous metal particles to be manufactured may be changed through a patterning of the photosensitive film 130 or the mask 140.

Figure 18:
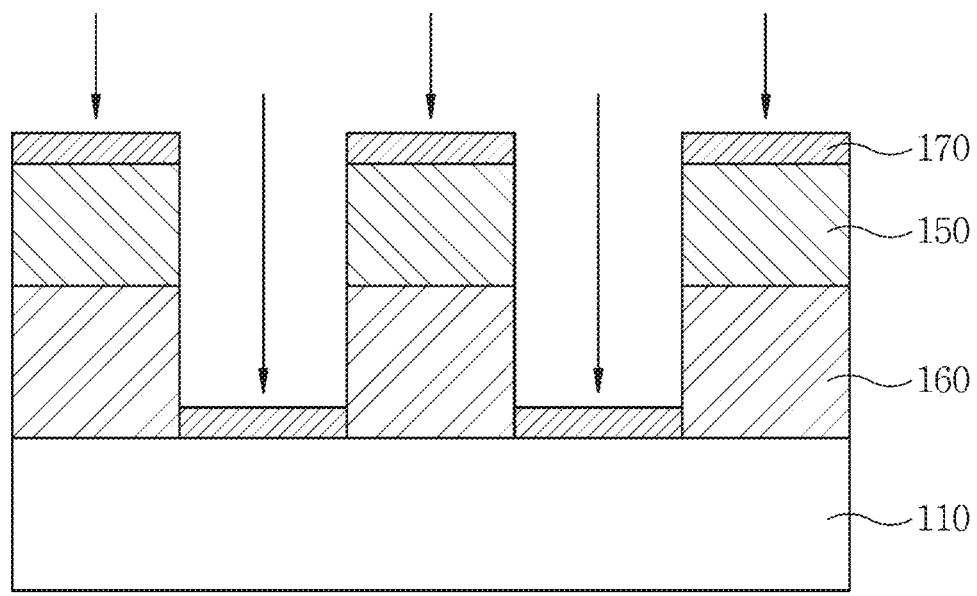

Afterwards, as shown in FIG. 18, an amorphous metal thin film 170 is formed on the photosensitive film pattern 150, in step S119, by the sputtering that uses the amorphous aluminum alloy target. At this time, the amorphous metal thin film 170 may be deposited on the photosensitive film pattern 150 as well as a portion of the base substrate 110 exposed between adjacent photosensitive film patterns 150.

Figure 19:
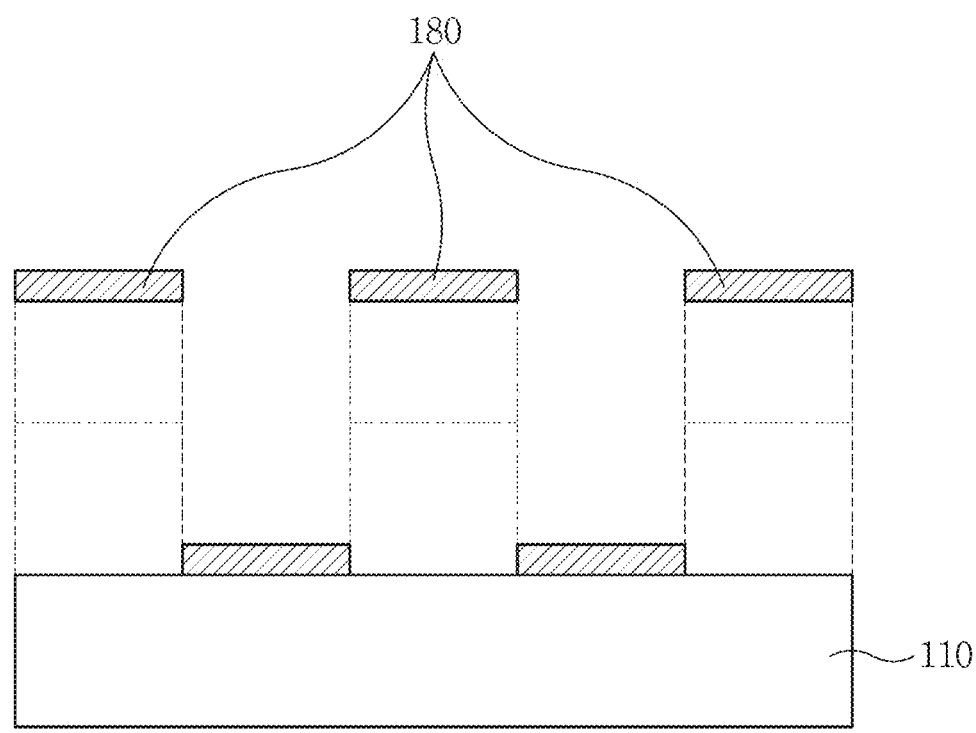

Then, as shown in FIGS. 18 and 19, the photosensitive film pattern 150 is removed to separate the amorphous metal thin film 170 in step 3121. The amorphous metal thin film 170 on the photosensitive film pattern 150 can be separated easily by dissolving the photosensitive film pattern 150 with the solvent. The amorphous metal thin film 170 separated as above is the amorphous metal particles 180.

Second Embodiment of Manufacturing Method

Though the amorphous metal particles were manufactured using the photosensitive film pattern in the first embodiment described above, the present disclosure is not limited thereto. For example, as shown in FIG. 20, the amorphous metal particles may be manufactured through a crushing process instead of using the photosensitive film pattern.

Figure 20:
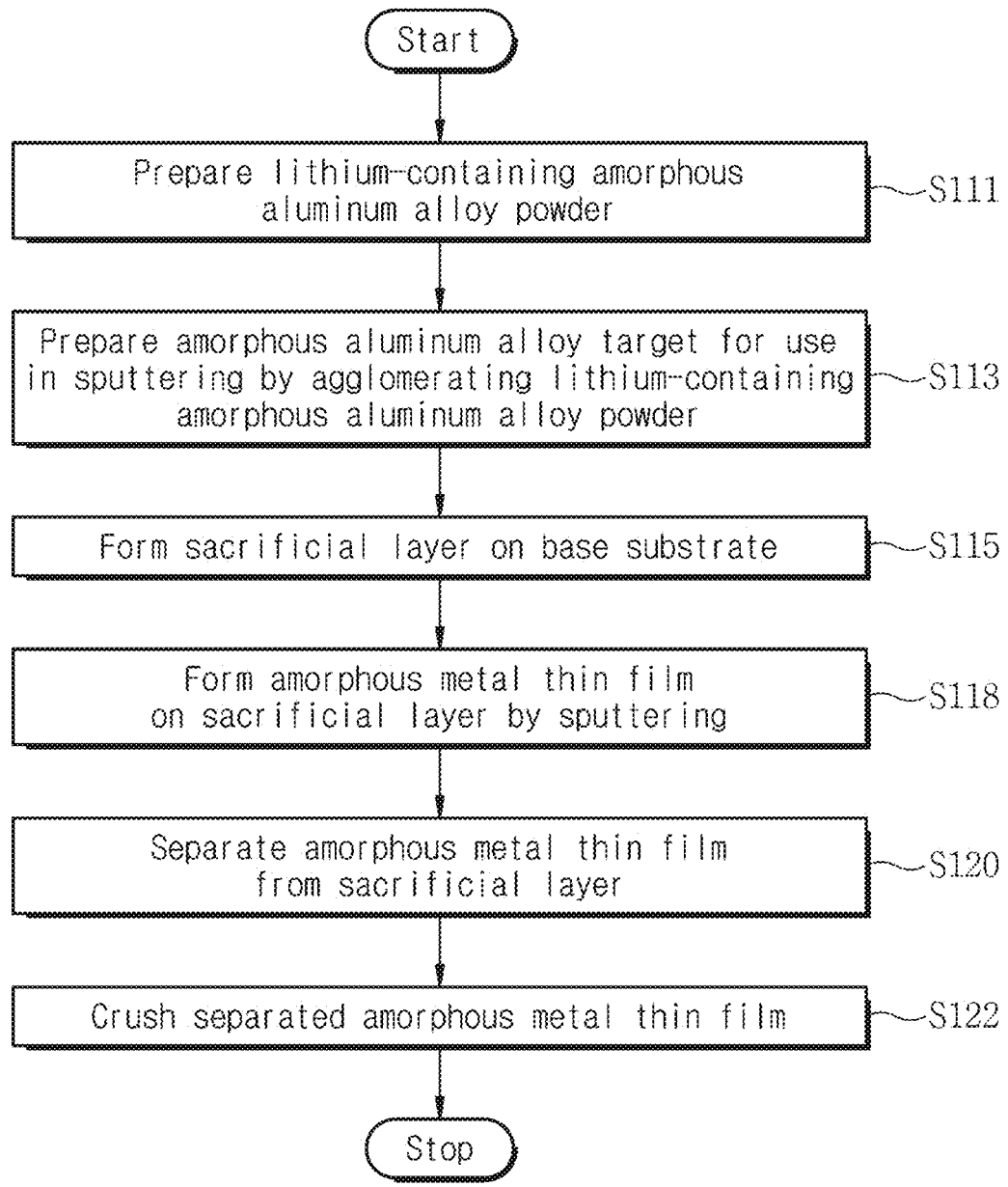
FIG. 20 is a flowchart illustrating a second embodiment of a method of manufacturing amorphous metal particles according to the present disclosure.

FIG. 20 is a flowchart illustrating a second embodiment of the method of manufacturing amorphous metal particles according to the present disclosure.

Steps S111 through S115 of the method of manufacturing the amorphous metal particles according to the second embodiment shown in FIG. 20 may be performed in the same manner as corresponding steps in the first embodiment shown in FIG. 14, and detailed description thereof will be omitted for simplicity.

In step S118, the amorphous metal thin film is formed on the sacrificial layer by the sputtering that uses the amorphous aluminum alloy target. At this time, the amorphous metal thin film is formed on the entire surface of the sacrificial layer.

Subsequently, the amorphous metal thin film is separated from the sacrificial layer in step 3120. The amorphous metal thin film can be separated from the base substrate by dissolving and removing the sacrificial layer with the solvent. For example, if the base substrate on which the amorphous metal thin film is formed is introduced into a solution tank containing the solvent capable of dissolving the sacrificial layer, the sacrificial layer is dissolved by the solvent. As a result, the amorphous metal thin film may be separated from the base substrate.

In step 3122, the amorphous metal particles according to the present disclosure may be obtained by crushing the amorphous metal thin film separated in the step S120. At this time, the amorphous metal thin film separated in the step S120 may be crushed through an ultrasonic treatment, and obtained amorphous metal particles may have random sizes and shapes.

Third Embodiment of Manufacturing Method

Though the amorphous metal particles were manufactured using the sacrificial layer in the first and second embodiments described above, the present disclosure is not limited thereto. For example, as shown in FIG. 21, the amorphous metal thin film may be directly formed on the base substrate to obtain amorphous metal particles.

Figure 21:
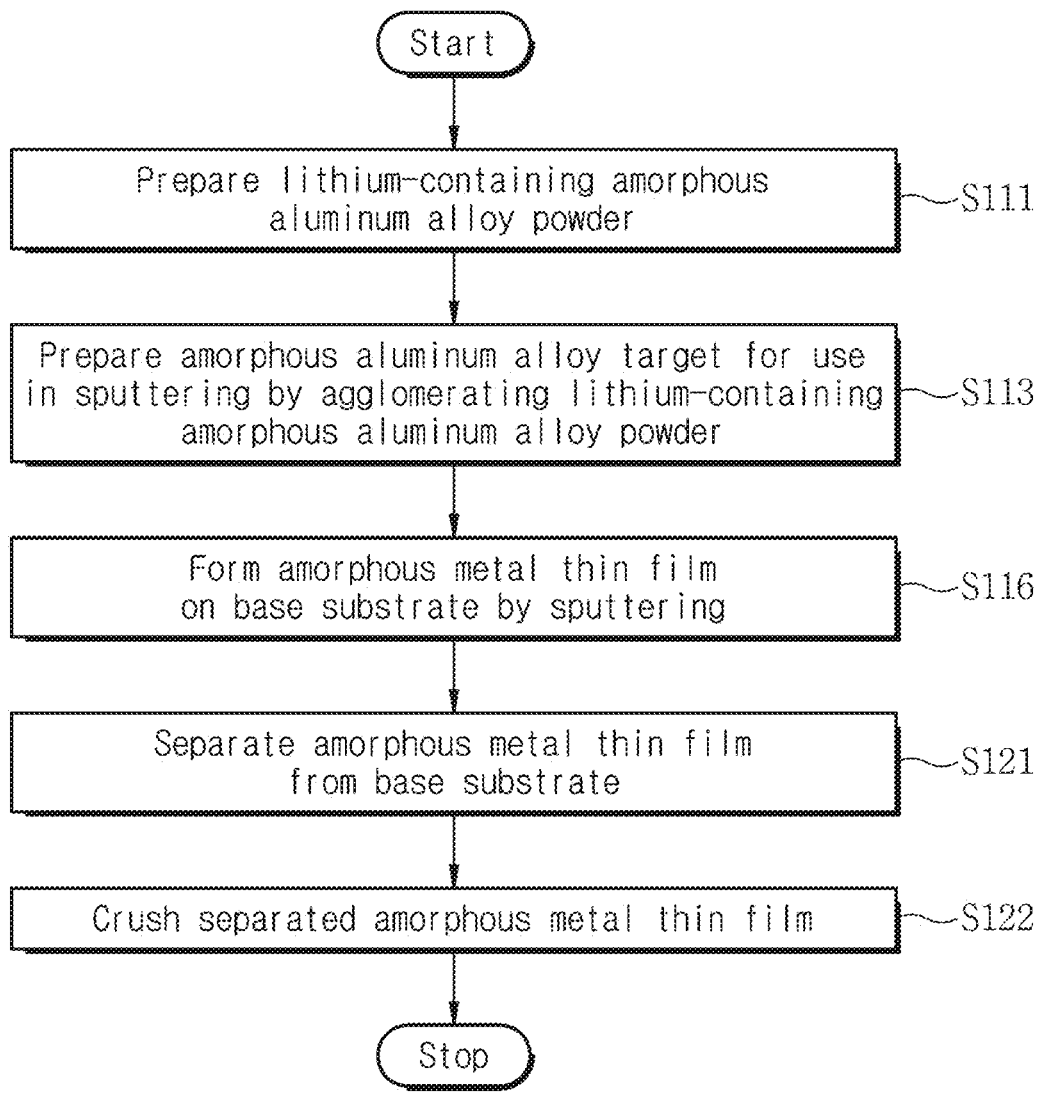
FIG. 21 is a flowchart illustrating a third embodiment of a method of manufacturing amorphous metal particles according to the present disclosure.

FIG. 21 is a flowchart illustrating a third embodiment of the method of manufacturing amorphous metal particles according to the present disclosure.

Steps S111 and S113 of the method of manufacturing the amorphous metal particles according to the third embodiment shown in FIG. 21 may be performed in the same manner as corresponding steps in the first embodiment shown in FIG. 14, and detailed description thereof will be omitted for simplicity.

In step S116, the amorphous metal thin film is formed on the base substrate by the sputtering that uses the amorphous aluminum alloy target. At this time, the amorphous metal thin film is formed on the entire surface of the base substrate.

At this time, the base substrate may be made of a material that the amorphous metal thin film weakly adheres to, so that the amorphous metal thin film can be separated easily from the base substrate. For example, a Teflon-based, polyimide-based, or silicone-based plastic resin may be used as the material for the base substrate.

Subsequently, the amorphous metal thin film is separated from the base substrate in step 3121. For example, the amorphous metal thin film can be separated from the base substrate by using a transfer substrate having an adhesive force.

In step S122, the amorphous metal particles according to the present disclosure may be obtained by crushing the amorphous metal thin film separated in the step S121. At this time, the amorphous metal thin film separated in the step S121 may be crushed through an ultrasonic treatment, and obtained amorphous metal particles may have random sizes and shapes.

The amorphous metal particles manufactured according to the first embodiment have a regular size and shape since the amorphous metal particles are manufactured by using the photosensitive film pattern. In detail, the amorphous metal particles manufactured according to the first embodiment first may have shapes of flakes or tubes, Contrarily, the amorphous metal particles manufactured according to the second and third embodiments have random sizes and shapes because the flakes are obtained by crushing a wide amorphous metal thin film.

The amorphous metal particles manufactured as above may be used as one of ingredients of the conductive ink.

Example 2 and Comparative Example 2

In order to evaluate amorphousness of the amorphous metal particles manufactured according to the manufacturing method of the present disclosure, the lithium-containing amorphous aluminum alloy, the amorphous metal thin film, and the lithium-containing amorphous metal particles were prepared according to the manufacturing methods of the first through third embodiments.

The lithium-containing amorphous aluminum alloy was prepared in accordance with an atomic ratio of Table 1, and then the amorphous aluminum alloy target was prepared using the amorphous aluminum alloy.

TABLE 2

|  | Al | Ni | Y | Li |
|---|---|---|---|---|
| Design | 83.5 | 5.0 | 7.5 | 4.0 |
| Powder | 84.7 | 5.2 | 5.0 | 5.1 |
| Target | 84.0 | 5.2 | 5.6 | 4.9 |
| 100 nm Thin Film | 84.4 | 5.1 | 5.5 | 5.0 |
| Composition Deviation (atomic %) | 0.9 | 0.1 | 2.0 | 1.0 |

Figure 22:
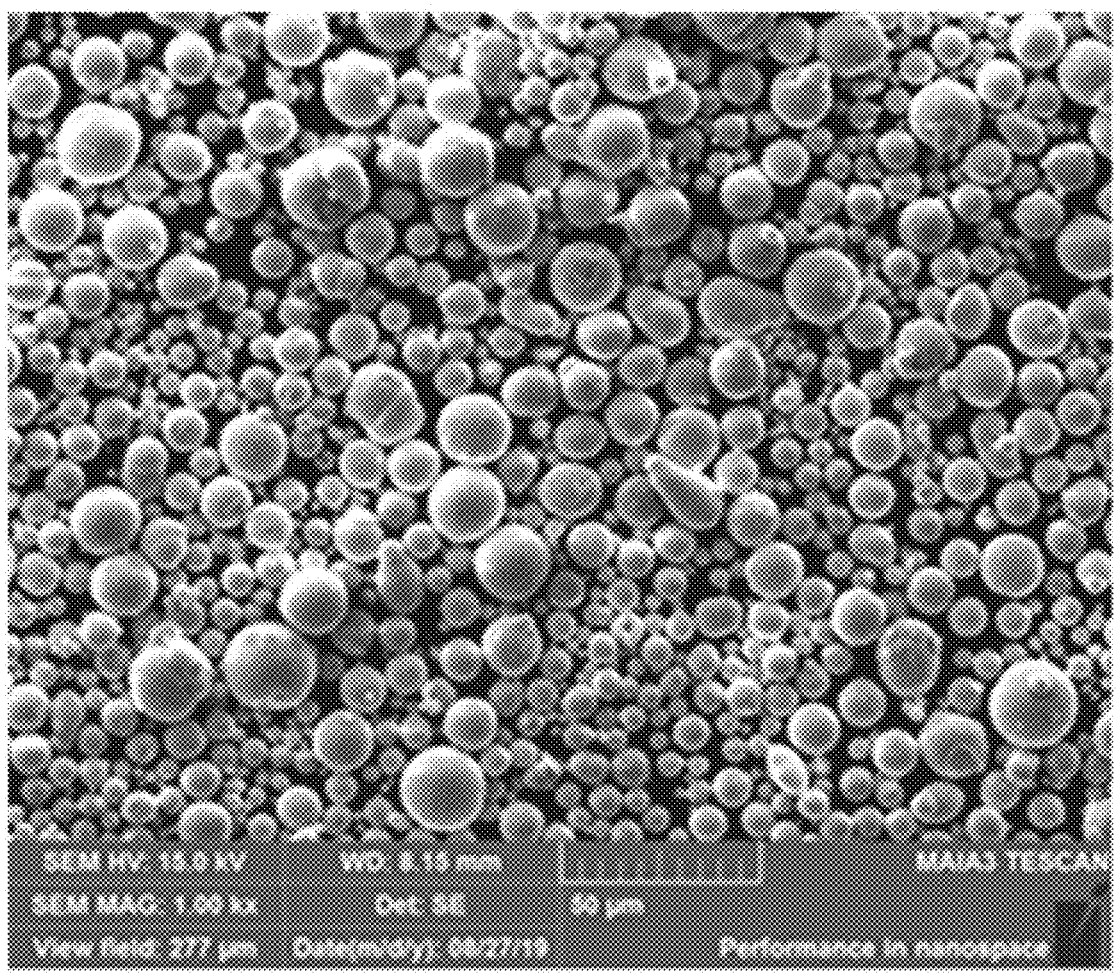
FIGS. 22 and 23 are SEM images of lithium-containing amorphous metal particles.
Figure 23:
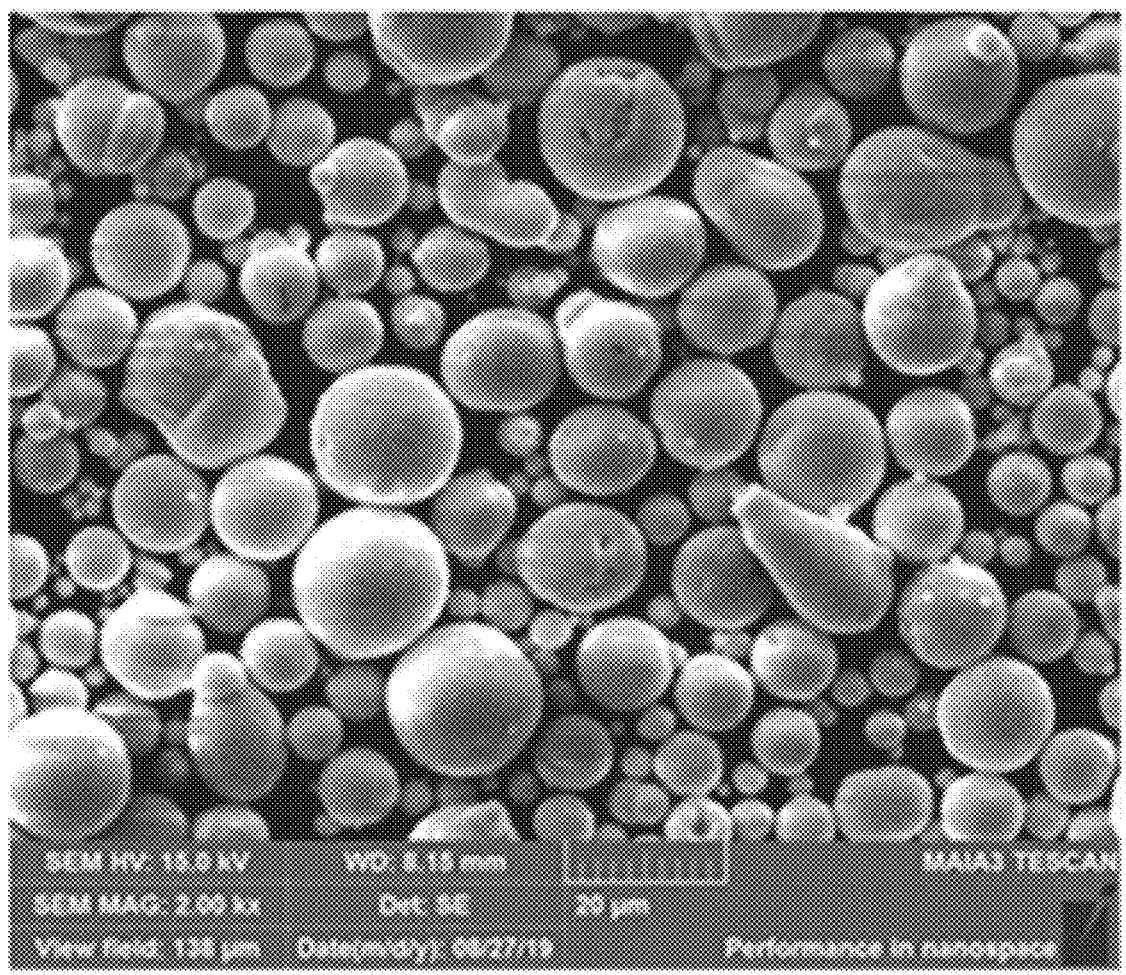

FIGS. 22 and 23 are SEM images of the lithium-containing amorphous metal particles. Referring to FIGS. 22 and 23, raw materials having the atomic ratio of Table 2 are introduced into an atomizer, melted, and powdered to prepare the lithium-containing amorphous aluminum alloy powder. The lithium-containing amorphous aluminum alloy powder was prepared to have shapes of spheres and have diameters of 20 μm or smaller in diameter.

Figure 24:
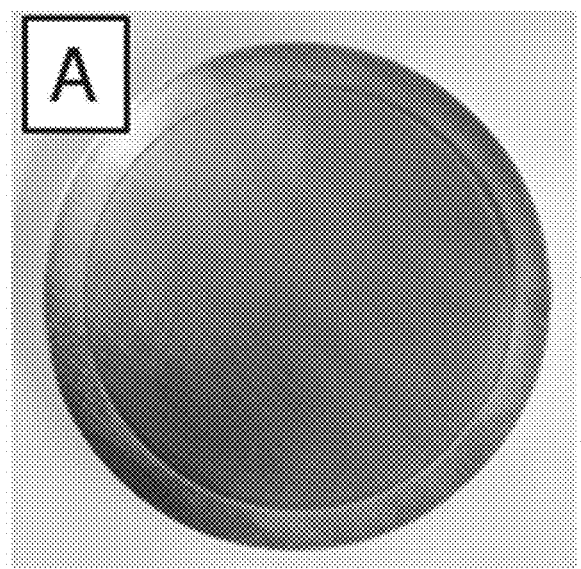
FIG. 24 shows photographs of sputtering targets according to Example 2 and Comparative Example 2.
Figure 24:
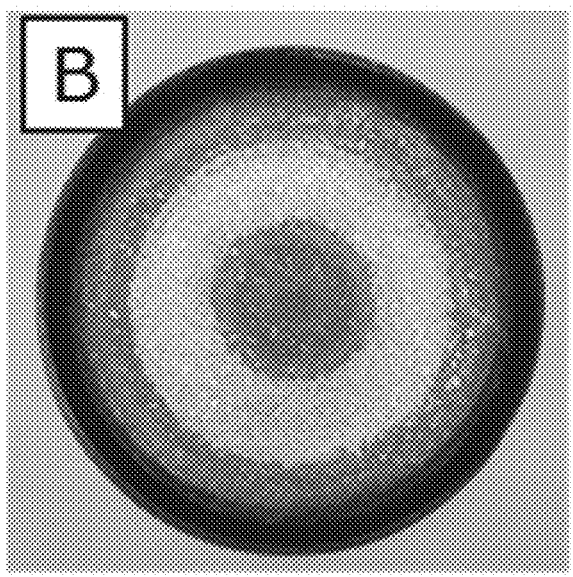

FIG. 24 shows photographs of sputtering targets according to Example 2 and Comparative Example 2. In FIG. 24, portion A shows an amorphous aluminum alloy target made of the amorphous aluminum alloy powder, and portion B shows a crystalline aluminum target. It is observed that the crystalline aluminum target shown in the portion B has a rough surface due to a presence of crystal grains of the crystalline aluminum. Contrarily, the amorphous aluminum alloy target has less rough surface roughness than the crystalline aluminum target.

Comparative Evaluation of Amorphous Structure

Figure 25:
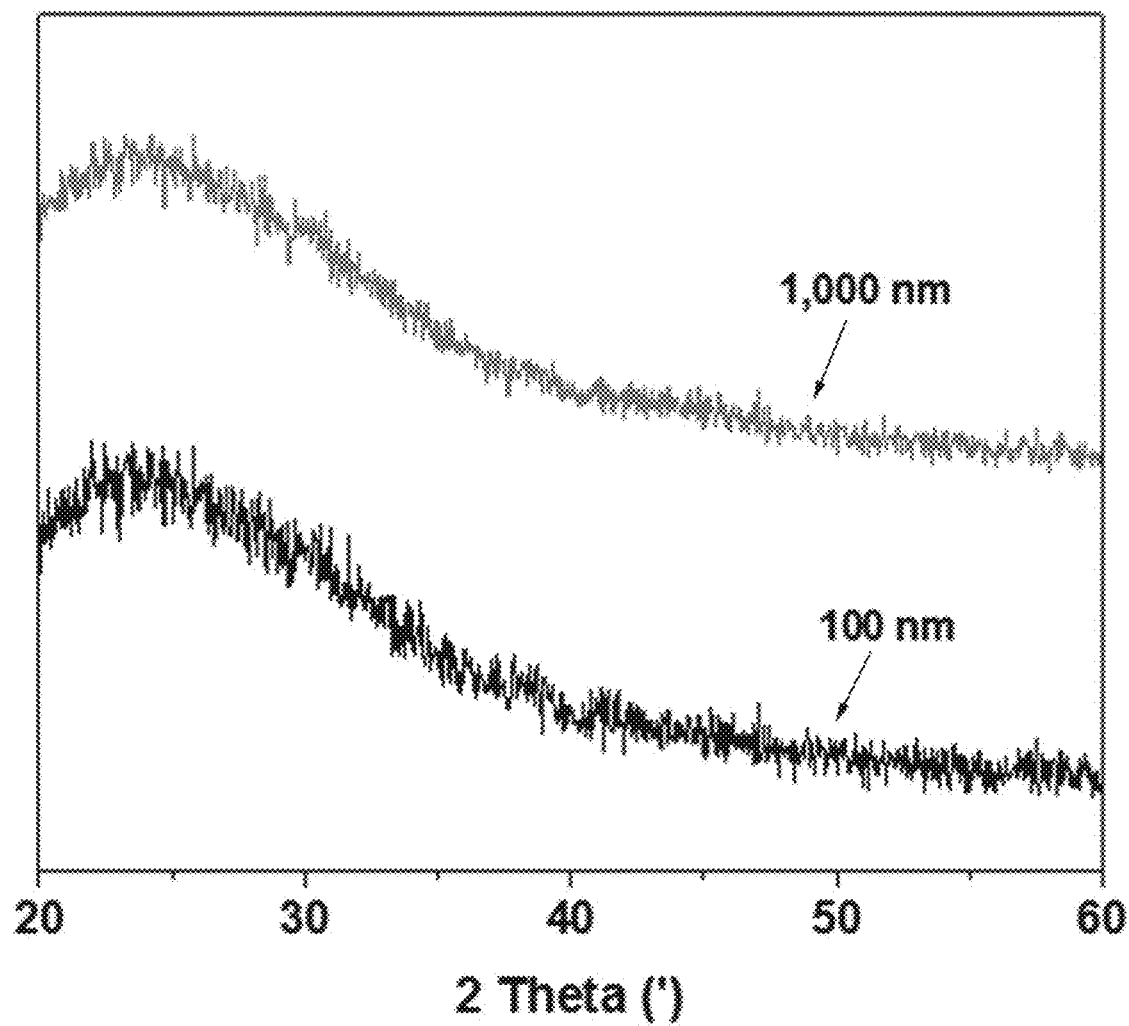
FIG. 25 is a graph illustrating results of X-ray diffraction analyses for aluminum-based amorphous metal thin films, of several thicknesses, manufactured by sputtering.

FIG. 25 is a graph illustrating results of X-ray diffraction analyses for aluminum-based amorphous metal thin films, of several thicknesses, manufactured by sputtering.

Referring to FIG. 25, the metal thin films were deposited to a thicknesses of 100 nm and 1000 nm on the base substrate by sputtering using the amorphous aluminum alloy target.

The X-ray diffraction analyses revealed that the metal thin films deposited on the base substrate at the thicknesses of 100 nm to 1000 nm were the amorphous metal thin film having the amorphous structure.

Figure 26:
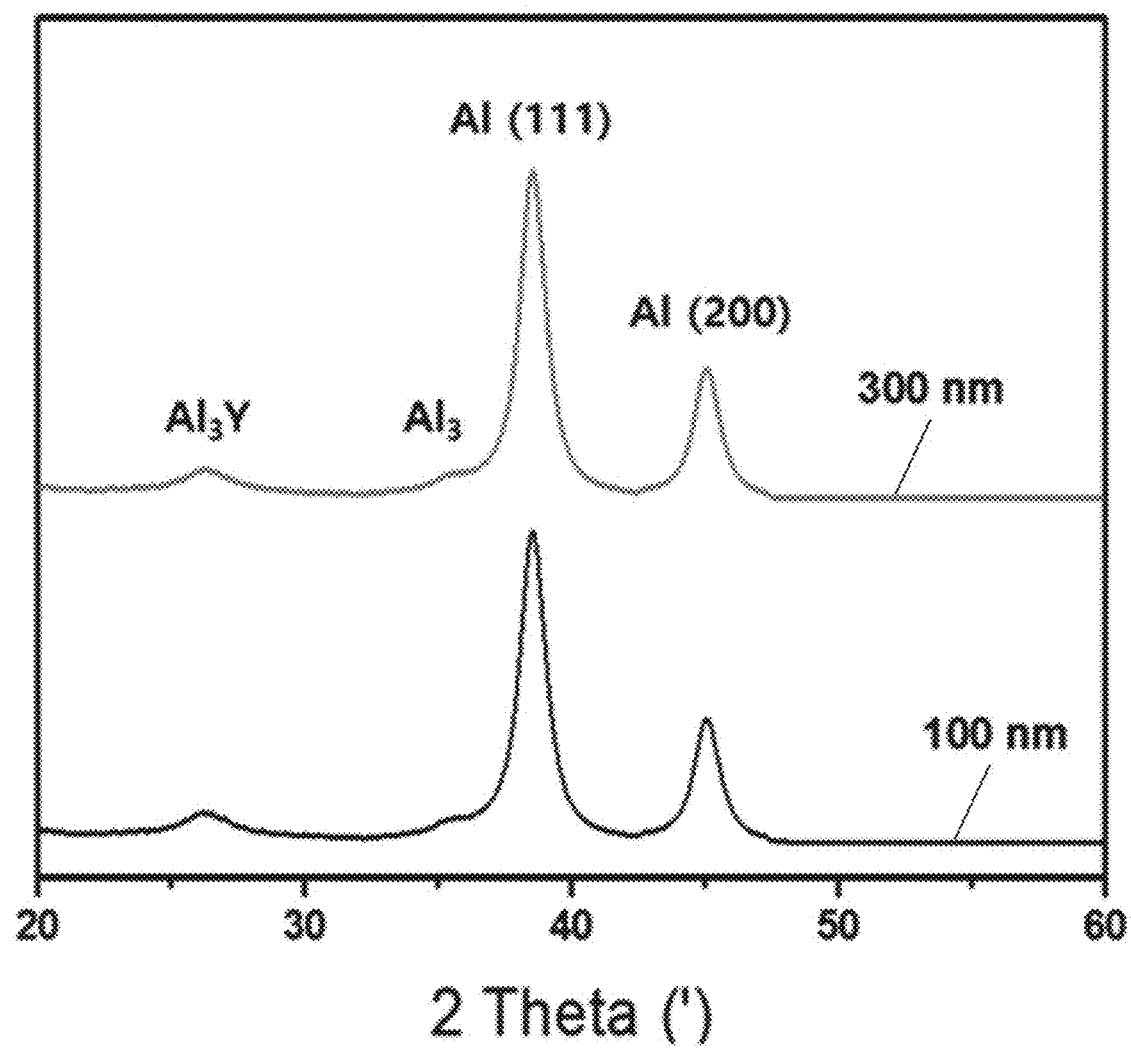
FIG. 26 is a graph illustrating results of X-ray diffraction analyses for an aluminum-based crystalline metal thin film.
Figure 27:
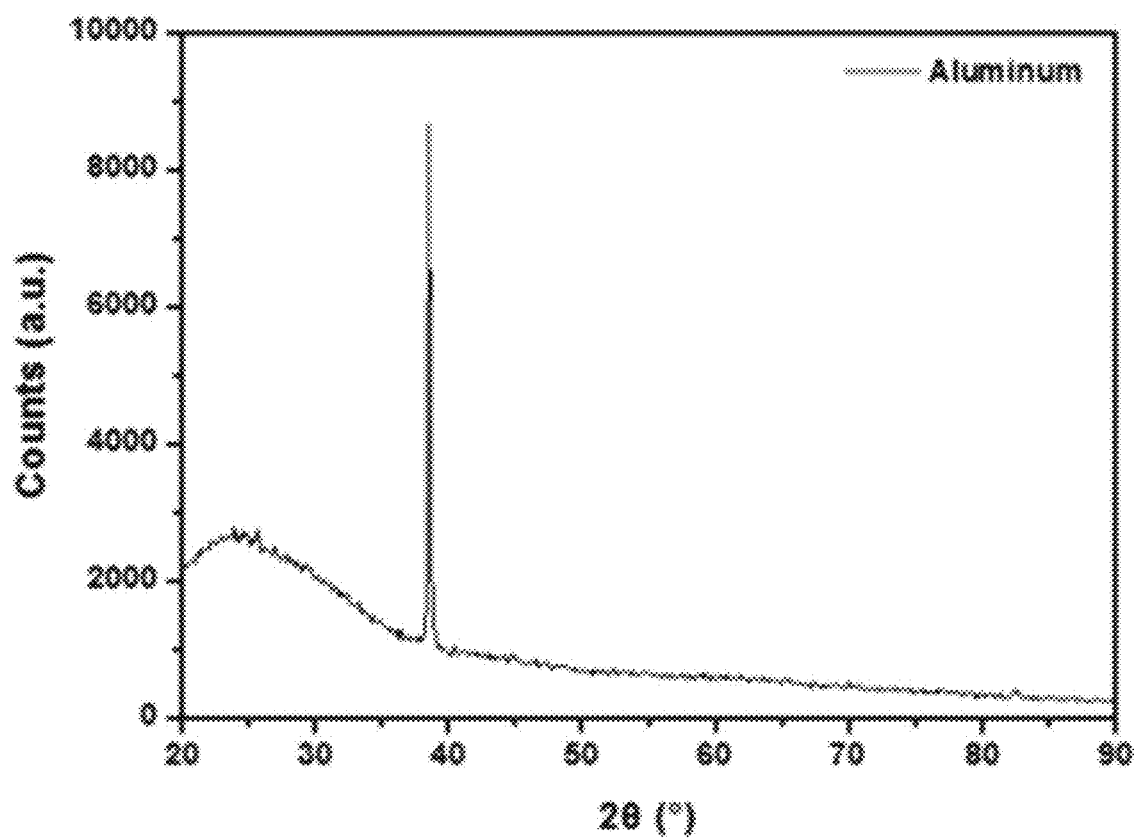
FIG. 27 is a graph illustrating a result of an X-ray diffraction analysis for an aluminum thin film.

In case that the deposited metal thin film was formed to have the crystalline structure, for example, rather than the amorphous structure due to a compositional or process problem, the X-ray diffraction analyses would show diffraction patterns having at least one peak such as those shown in FIGS. 26 and 27. Here, FIG. 26 is a graph illustrating results of X-ray diffraction analyses for an aluminum-based crystalline metal thin film, and FIG. 27 is a graph illustrating a result of an X-ray diffraction analysis for an aluminum thin film.

A comparison of the X-ray diffraction analyses of FIGS. 25 to 27 shows that the metal thin film manufactured according to the Example exhibits a property of a material having the amorphous structure.

Shapes of Amorphous Metal Particles

Figure 28:
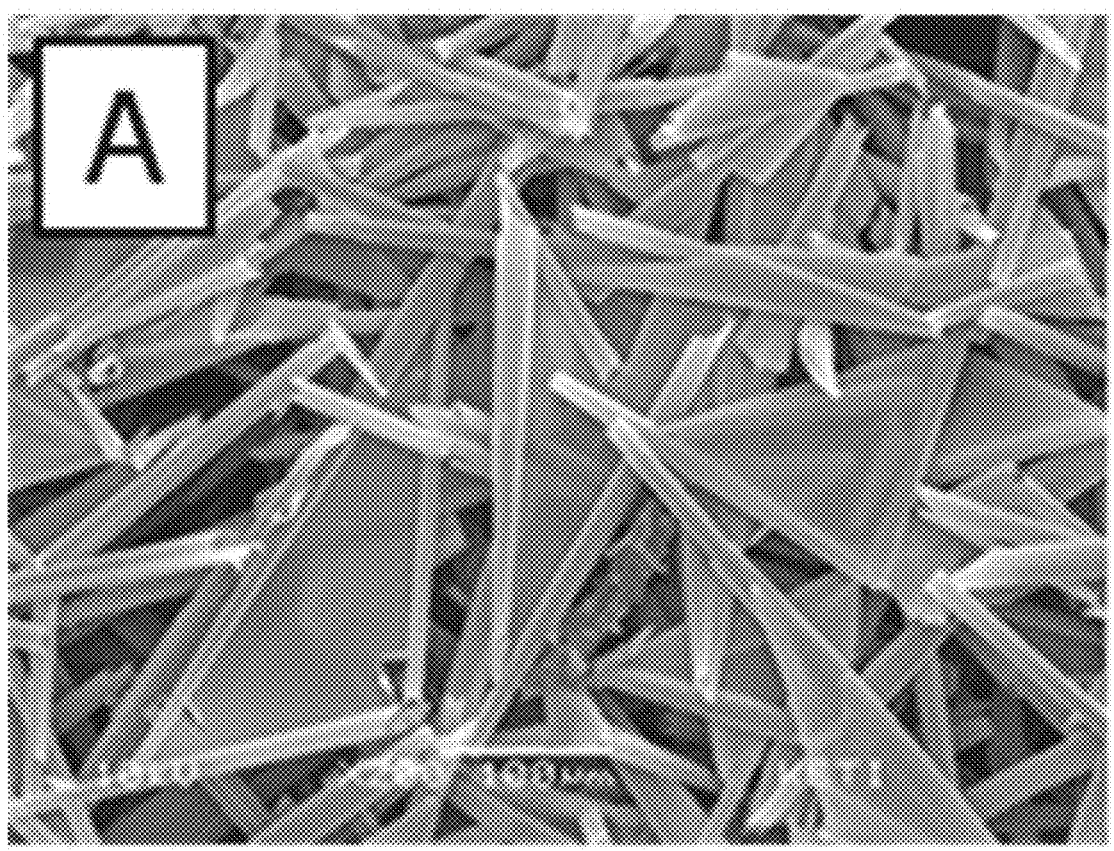
FIG. 28 is a SEM image of amorphous metal particles according to Example 2 prepared by a manufacturing method of a first embodiment.
Figure 29:
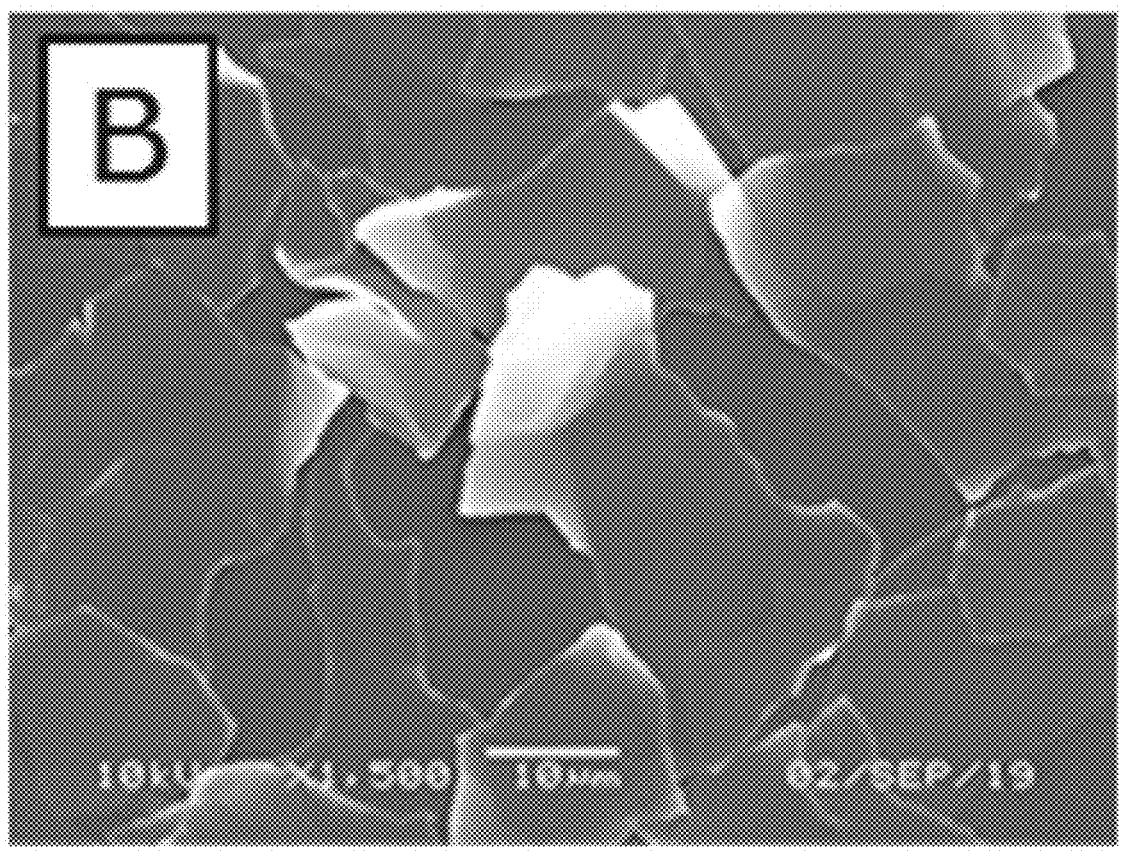
FIG. 29 is a SEM image of amorphous metal particles according to Example 2 prepared by a manufacturing method of a second embodiment.
Figure 30:
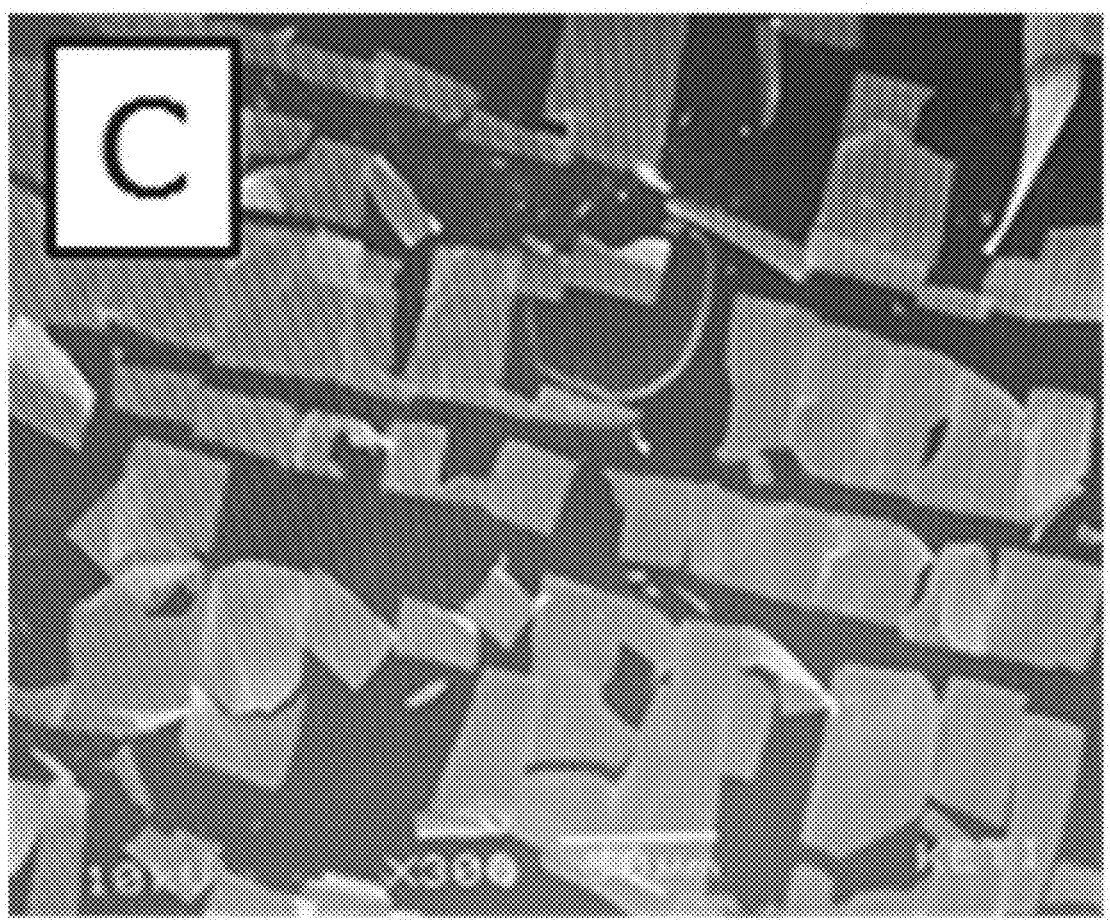
FIG. 30 is a SEM image of amorphous metal particles according to Example 2 prepared by a manufacturing method of a third embodiment.

FIG. 28 is a SEM image of the amorphous metal particles according to Example 2 prepared by the manufacturing method of the first embodiment. FIG. 29 is a SEM image of the amorphous metal particles according to Example 2 prepared by the manufacturing method of the second embodiment. FIG. 30 is a SEM image of the amorphous metal particles according to Example 2 prepared by the manufacturing method of the third embodiment.

Referring to FIG. 28, the amorphous metal particles according to Example 2 have a flake or tube shape. According to the first embodiment of the manufacturing method, the size of the photosensitive film pattern can be adjusted. In case that the size of the photosensitive film pattern is large and thus the areas of the flakes are large, the amorphous metal particles may be rolled up into a tube shape to become nanotubes. In case that the size of the photosensitive film pattern is reduced or the thickness of the flakes is increased, the amorphous metal particles may maintain the flake shape.

In FIGS. 29 and 30, it can be easily observed that the amorphous metal particles according to the second and third embodiments which are prepared by crushing the amorphous metal thin film have random shapes.

Figure 31:
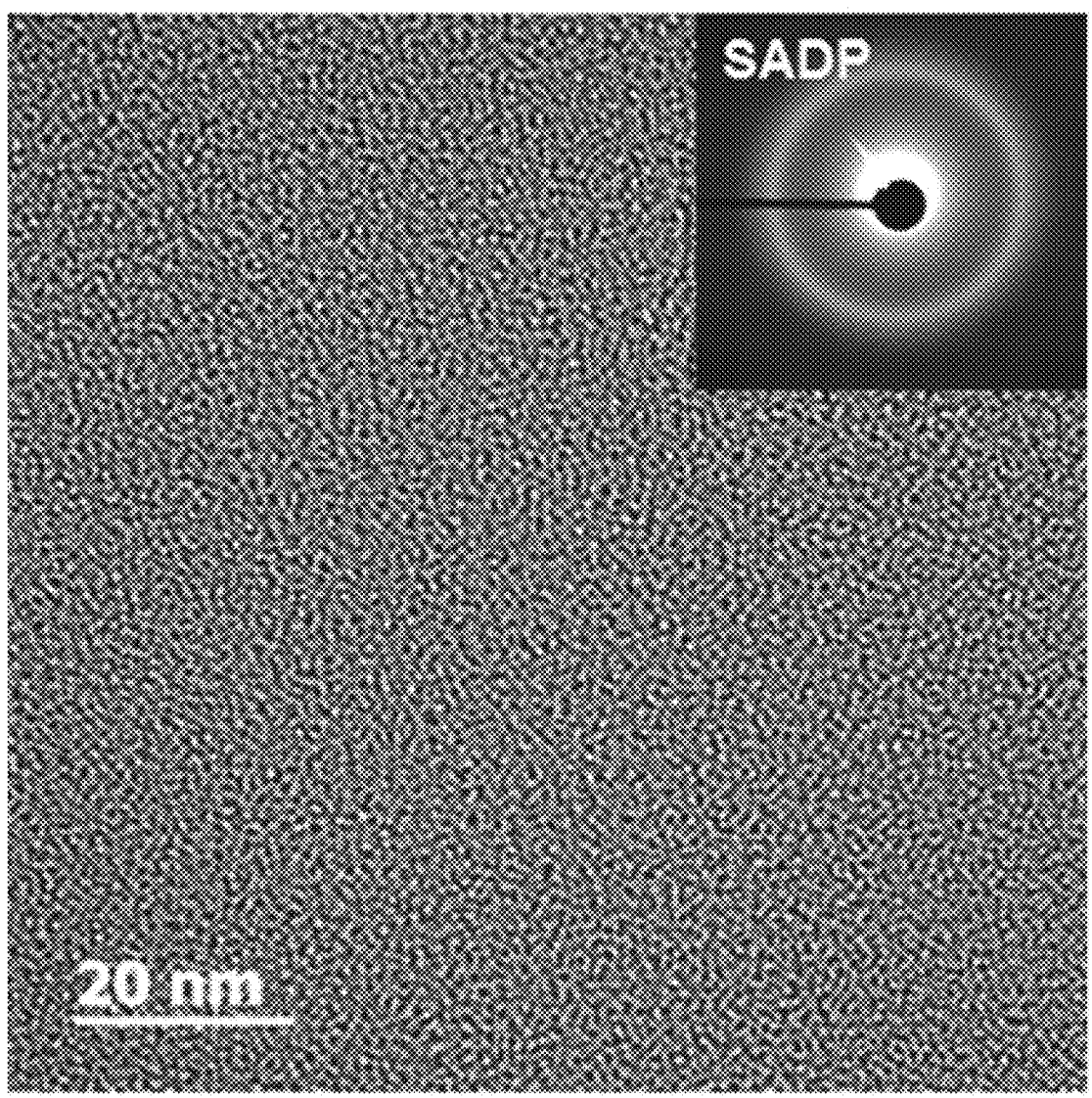
FIG. 31 is a HRTEM image and a SADP analysis image of the amorphous metal particles according to Example 2.

FIG. 31 is a HRTEM image and a SADP analysis image of the amorphous metal particles according to Example 2.

Referring to FIG. 31, it is observed that an amorphous SADP appears without any periodic lattice fringe in the HRTEM image for the amorphous metal particles according to Example 2.

Work Function of Amorphous Metal Particles

Figure 32:
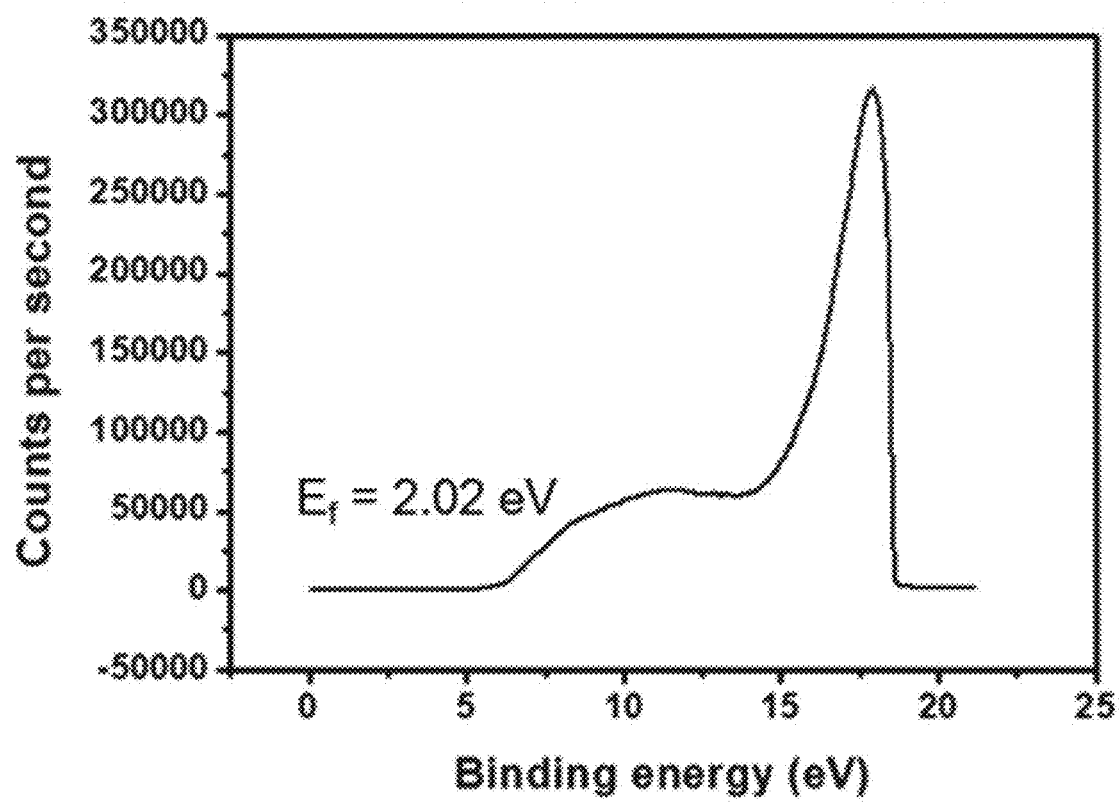
FIGS. 32 and 33 are graphs illustrating ultraviolet photoelectron spectroscopy (UPS) spectra of amorphous metal particles $Al_{84.5}Li_5Ni_5Y_{5.5}$ according to Example 2-1.
Figure 33:
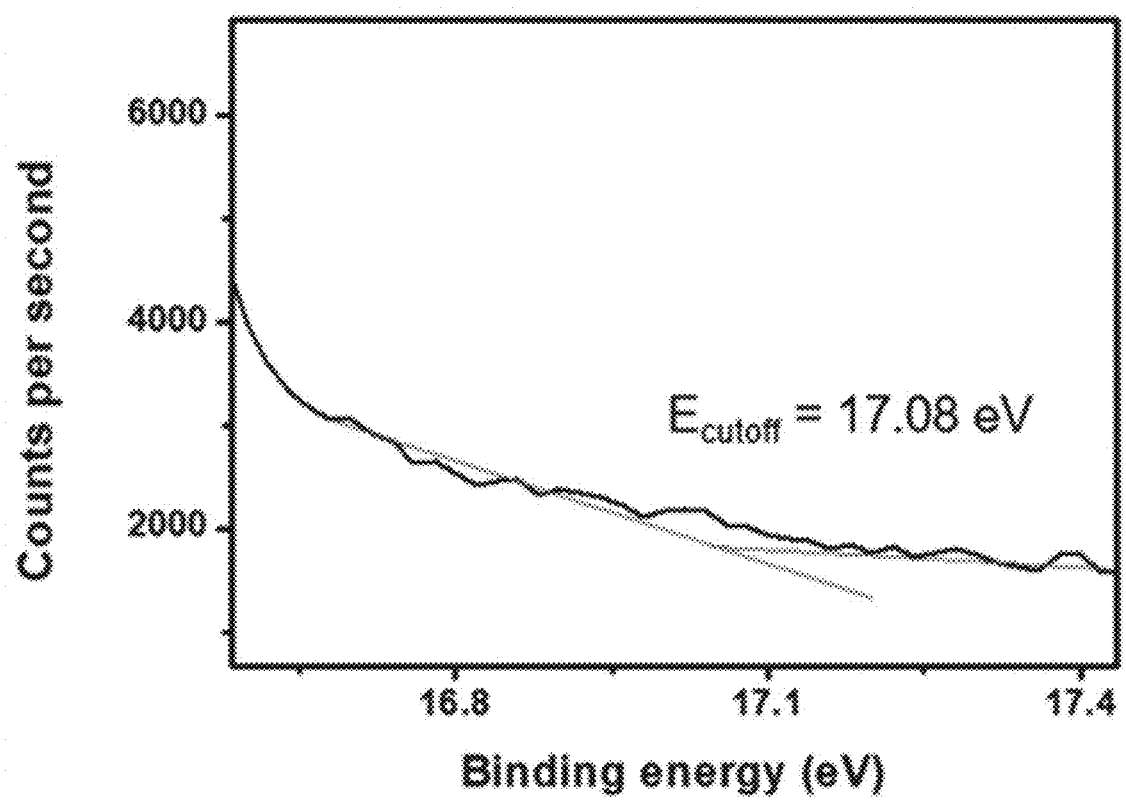

FIGS. 32 and 33 are graphs illustrating ultraviolet photoelectron spectroscopy (UPS) spectra of amorphous metal particles according to Example 2-1. Here, the UPS spectrum of FIG. 33 is an enlarged view of a portion of the UPS spectrum of FIG. 32.

Referring to FIGS. 32 and 33, the amorphous metal particles according to Example 2-1 contains lithium in an atomic ratio (y) of 5 and may be represented by a formula of $Al_{84.5}Li_5Ni_5Y_{5.5}$. The amorphous metal particles according to Example 2-1 were prepared by the manufacturing method of the second embodiment.

A work function (ϕ) of the amorphous metal particles according to Example 2-1 can be calculated by Equation 1 below after obtaining a high-bonding-energy cutoff ($E_{cutoff}$) from the UPS spectrum.

$$\phi = h - E_{cutoff} \text{ (where, excitation photon energy } h=32.22 \text{ eV)} \quad \text{[Equation 1]}$$

The high-bonding-energy cutoff ($E_{cutoff}$) value was measured to be 17.08 eV from the UPS spectrum, and the work function ($\phi$) of the amorphous metal particles according to Example 2-1 is calculated to be 4.12 eV from Equation 1.

That is, it can be seen that the amorphous metal particles according to Example 2-1 have a work function lower than a work function 4.30 eV of pure aluminum.

In order to check a change in the work function according to the atomic ratio of lithium in the amorphous metal particles according to the present disclosure, amorphous metal particles according to Example 2-2 containing lithium in an atomic ratio (y) of 2.5 was prepared and its work function was calculated by Equation 1.

Figure 34:
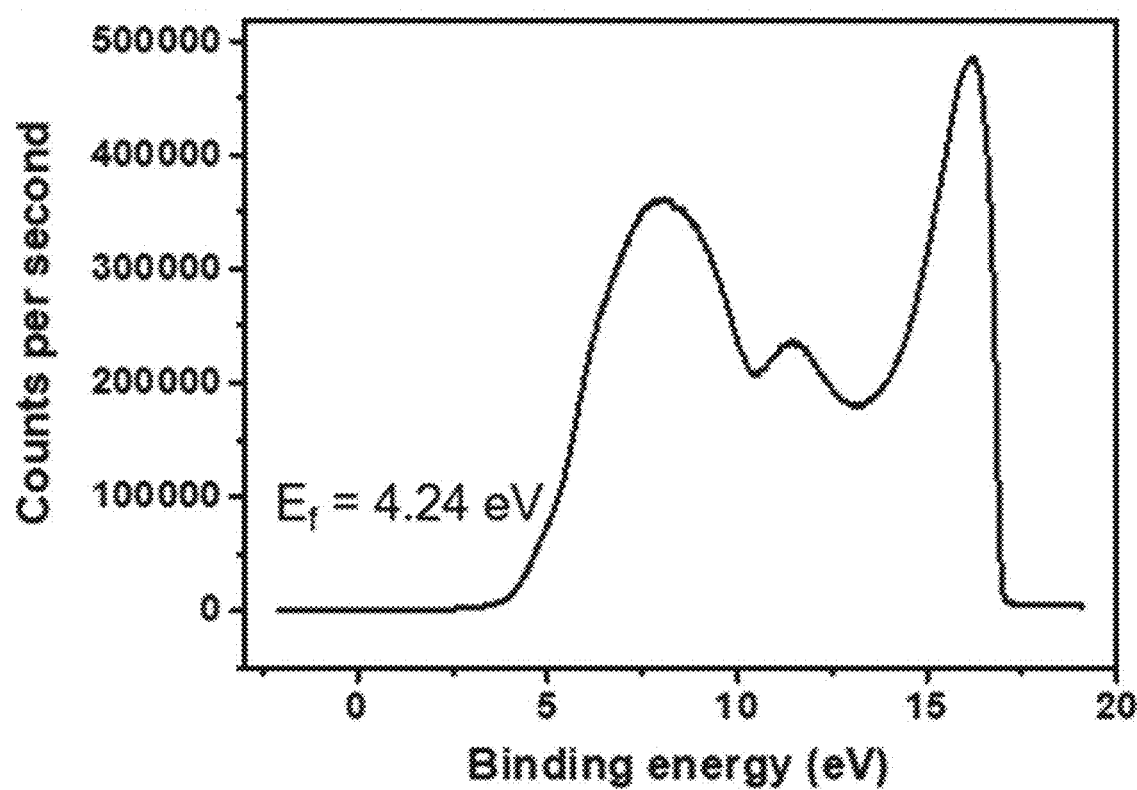
FIGS. 34 and 35 are graphs illustrating UPS spectra of amorphous metal particles $Al_{87}Li_{2.5}Ni_5Y_{5.5}$ according to Example 2-2.
Figure 35:
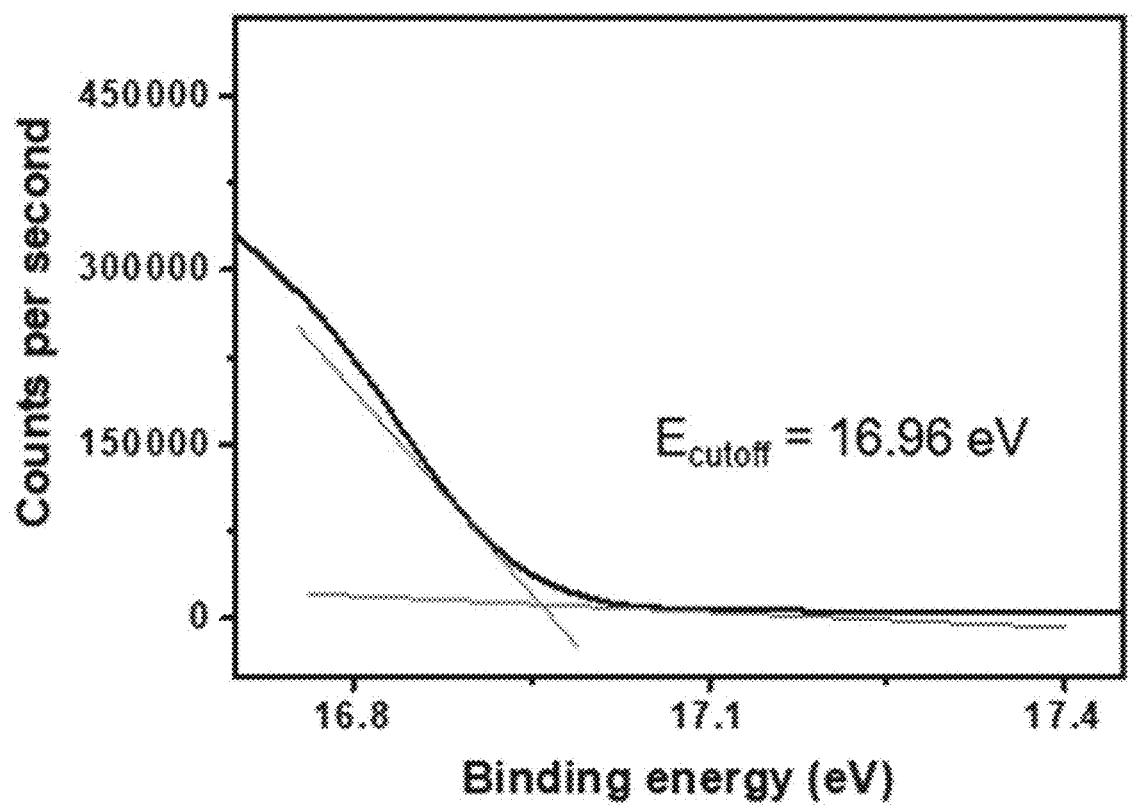

FIGS. 34 and 35 are graphs illustrating UPS spectra of the amorphous metal particles $Al_{87}Li_{2.5}Ni_5Y_{5.5}$ according to Example 2-2.

The amorphous metal particles according to Example 2-2 contains lithium in an atomic ratio (y) of 2.5 and may be represented by a formula of $Al_{87}Li_{2.5}Ni_5Y_{5.5}$. The amorphous metal particles according to Example 2-2 were prepared by the manufacturing method of the second embodiment.

Referring to FIGS. 34 and 35, the high-bonding-energy cutoff ($E_{cutoff}$) value was measured to be 16.96 eV from the UPS spectrum, and the work function ($\phi$) of the amorphous metal particles according to Example 2-2 is calculated to be 4.24 eV from Equation 1.

The amorphous metal particles according to Example 2-2 are lower than the work function 4.30 eV of pure aluminum, but is higher than the work function 4.12 eV of the amorphous metal particles according to Example 2-1.

Therefore, in order to produce the amorphous metal particles having a work function of 4.20 eV or lower, it is desirable to prepare the amorphous metal particles according to the present disclosure such that the atomic ratio (y) of lithium is in a range of $3.0 < y \leq 7.0$.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A method of manufacturing amorphous metal particles, comprising:
   forming an amorphous metal thin film on a base substrate by sputtering using an amorphous aluminum alloy target made of a material represented by a formula $Al_xLi_yNi_zY_wCo_v$; and
   separating the amorphous metal thin film from the base substrate,
   wherein x, y, z, w, and v denote an atomic ratio and satisfy the following relationships: $75.0 \leq x \leq 90.0$, $3.0 < y \leq 7.0$, $1.0 \leq z \leq 7.0$, $2.0 \leq w \leq 10.0$, $0.0 \leq v \leq 5.5$, and $x+y+z+w+v=100$.

2. The method of claim 1, wherein the amorphous metal thin film has a thickness of 20 nm to 1000 nm.

3. The method of claim 1, wherein forming the amorphous metal thin film comprises:
   preparing an amorphous aluminum alloy powder having a composition of the formula; and
   agglomerating the amorphous aluminum alloy powder to prepare the amorphous aluminum alloy target for use in the sputtering.

4. The method of claim 3, wherein preparing the amorphous aluminum alloy powder comprises:
   introducing raw materials having the atomic ratio of the formula into an atomizer, melting the raw materials, and making a hardened material into powder.

5. The method of claim 4, wherein the amorphous aluminum alloy powder has a particle diameter of 20 μm or smaller.

6. The method of claim 3, wherein forming the amorphous metal thin film further comprises:
   forming a sacrificial layer of a plastic material on a base substrate; and
   forming the amorphous metal thin film on the sacrificial layer by sputtering using the amorphous aluminum alloy target,
   wherein, when the amorphous metal thin film is separated from the base substrate, the amorphous metal thin film is separated from the sacrificial layer.

7. The method of claim 6, further comprising:
   crushing a separated amorphous metal thin film to obtain the amorphous metal particles.

8. The method of claim 3, wherein forming the amorphous metal thin film further comprises:
   forming the amorphous metal thin film on the base substrate by sputtering using the amorphous aluminum alloy target,
   wherein, when the amorphous metal thin film is separated from the base substrate, the amorphous metal thin film is separated directly from the base substrate.

9. The method of claim 8, further comprising:
   crushing a separated amorphous metal thin film to obtain the amorphous metal particles.

10. The method of claim 9, wherein the separated amorphous metal thin film is crushed through an ultrasonic treatment.

11. The method of claim 3, wherein forming the amorphous metal thin film further comprises:
    forming a sacrificial layer of a plastic material on a base substrate;
    forming a photosensitive film pattern on the sacrificial layer; and
    forming the amorphous metal thin film on the photosensitive film pattern by sputtering using the amorphous aluminum alloy target.

12. The method of claim 11, wherein the photosensitive film pattern has a pattern size corresponding to sizes of the amorphous metal particles to be manufactured.

13. The method of claim 12, wherein, when the amorphous metal thin film is separated from the base substrate, the amorphous metal thin film on the photoresist film pattern is obtained as the amorphous metal particles while the photoresist film pattern is removed.

* * * * *